(12) United States Patent
Ludwig

(10) Patent No.: US 8,522,184 B2
(45) Date of Patent: Aug. 27, 2013

(54) HIERACHICALLY-MODULAR NANOELECTRONIC DIFFERENTIAL AMPLIFIERS, OP AMPS, AND ASSOCIATED CURRENT SOURCES UTILIZING CARBON NANOTUBES, GRAPHENE NANORIBBONS, PRINTED ELECTRONICS, POLYMER SEMICONDUCTORS, OR OTHER RELATED MATERIALS

(75) Inventor: Lester F. Ludwig, Belmont, CA (US)

(73) Assignee: Pike Group LLC, Dover, DE (US)

( * ) Notice: Subject to any disclaimer, the term of this patent is extended or adjusted under 35 U.S.C. 154(b) by 71 days.

(21) Appl. No.: 13/114,833

(22) Filed: May 24, 2011

(65) Prior Publication Data

US 2011/0296363 A1    Dec. 1, 2011

Related U.S. Application Data

(60) Provisional application No. 61/348,366, filed on May 26, 2010.

(51) Int. Cl.
*G06F 17/50* (2006.01)

(52) U.S. Cl.
USPC ............ 716/122; 716/132; 716/129; 716/130

(58) Field of Classification Search
USPC .................. 716/122, 132, 129, 130; 703/16
See application file for complete search history.

(56) References Cited

U.S. PATENT DOCUMENTS

| | | | |
|---|---|---|---|
| 3,916,380 A | 10/1975 | Fletcher et al. | |
| 4,551,683 A | 11/1985 | Matsuo et al. | |
| 5,311,088 A | 5/1994 | Nelson | |
| 5,428,188 A * | 6/1995 | Dozier | 174/527 |
| 6,180,978 B1 * | 1/2001 | Chatterjee et al. | 257/327 |
| 7,196,574 B1 | 3/2007 | Vishinsky | |
| 7,838,809 B2 | 11/2010 | Ludwig | |
| 7,858,918 B2 | 12/2010 | Ludwig | |
| 2002/0053897 A1 * | 5/2002 | Kajiwara et al. | 323/272 |
| 2005/0002448 A1 | 1/2005 | Knight et al. | |
| 2005/0076316 A1 | 4/2005 | Pierrat et al. | |
| 2006/0119392 A1 * | 6/2006 | Nozoe et al. | 326/101 |
| 2006/0236271 A1 | 10/2006 | Zach | |
| 2007/0018692 A1 * | 1/2007 | Chang | 326/101 |
| 2007/0237273 A1 | 10/2007 | Tan et al. | |

(Continued)

OTHER PUBLICATIONS

Z. Chen et al. "An Integrated Logic Circuit Assembled on a Single Carbon Nanotube" Science, No. 5768, vol. 311, Mar. 24, 2006, p. 1735.

(Continued)

*Primary Examiner* — Phallaka Kik

(57) ABSTRACT

A method for implementing electronic circuit modules on elongated structures of semiconducting materials such as carbon nanotubes, graphene nanoribbons, elongated structures of semiconducting polymers or organic semiconductors, other related materials, and printed electronics strip structures is disclosed. The method provides that a plurality of modules can be implemented on distinct adjacent portions of the same elongated structure of semiconducting materials. In powering the modules, each circuit comprises a chain of electronic components arranged so that each end of the chain can function as a power supply terminal. Larger electronic circuit modules can be created from smaller module, and such a modular hierarchy may be extended to an arbitrary number of levels. In a Computer Aided Design (CAD) applications for nanoelectronics and printed electronics, designs for hierarchies electronic circuit modules can be stored and retrieved from one or more a libraries of circuit designs.

22 Claims, 39 Drawing Sheets

(56) References Cited

U.S. PATENT DOCUMENTS

| | | | |
|---|---|---|---|
| 2008/0051051 | A1 | 2/2008 | Kral |
| 2009/0101940 | A1* | 4/2009 | Barrows et al. ............... 257/204 |
| 2009/0212342 | A1* | 8/2009 | Roizin et al. ................. 257/316 |
| 2009/0313595 | A1* | 12/2009 | Moroz et al. .................... 716/10 |
| 2010/0250187 | A1* | 9/2010 | Zuber et al. ................... 702/179 |
| 2010/0306726 | A1 | 12/2010 | Ludwig |
| 2011/0062313 | A1 | 3/2011 | Ludwig |
| 2011/0062418 | A1 | 3/2011 | Ludwig |
| 2011/0092030 | A1* | 4/2011 | Or-Bach et al. ............... 438/129 |

OTHER PUBLICATIONS

Michael A. Riepe, Karem A. Sakallah, "Transistor placement for noncomplementary digital VLSI cell synthesis" ACM Transactions on Design Automation of Electronic Systems (TODAES), vol. 8 Issue 1, Jan. 2003.

Li Ding, Mazumder, P., "On optimal tapering of FET chains in high-speed CMOS circuits," IEEE Transactions on Circuits and Systems II: Analog and Digital Signal Processing, vol. 48 Issue: 12, Dec. 2001, pp. 1099-1109.

Bourguet Vincent, De Lamarre Laurent, Rosset-Louërat Marie-Minerve, "Analog IC Design with a Library of Parameterized Device Generators," 19th International Conference on Design of Circuits and Integrated Systems (DCIS'2004), Bordeaux, France, Nov. 2004, pp. 739-744.

Gielen, G.G.E.; Rutenbar, R.A., "Computer-aided design of analog and mixed-signal integrated circuits," Proceedings of the IEEE, vol. 88 Issue 12, Dec. 2000, pp. 1825-1854.

Bengt Nordén, Eva Krutmeijer, "The Nobel Prize in Chemistry, 2000: Conductive polymers," The Royal Swedish Academy of Sciences, Stockholm, Sweden, 2000, pp. 1-16.

Fix, W., Ullmann, A., Blache, R. and Schmidt, K. "Organic Transistors as a Basis for Printed Electronics," in Organic Electronics: Structural and Electronic Properties of OFETs (ed C. Wöll), Wiley-VCH Verlag GmbH & Co. KGaA, Weinheim, Germany. (2009).ch1, 6 pages.

ObservatoryNANO, "ICT Sector Focus Report: Printed Electronics," Apr. 2010, pp. 1-33.

Office Action in U.S. Appl. No. 12/791,040 issued Jul. 30, 2012, 6 pages.

Final Office Action in U.S. Appl. No. 12/791,040 issued Nov. 16, 2012, 15 pages.

\* cited by examiner

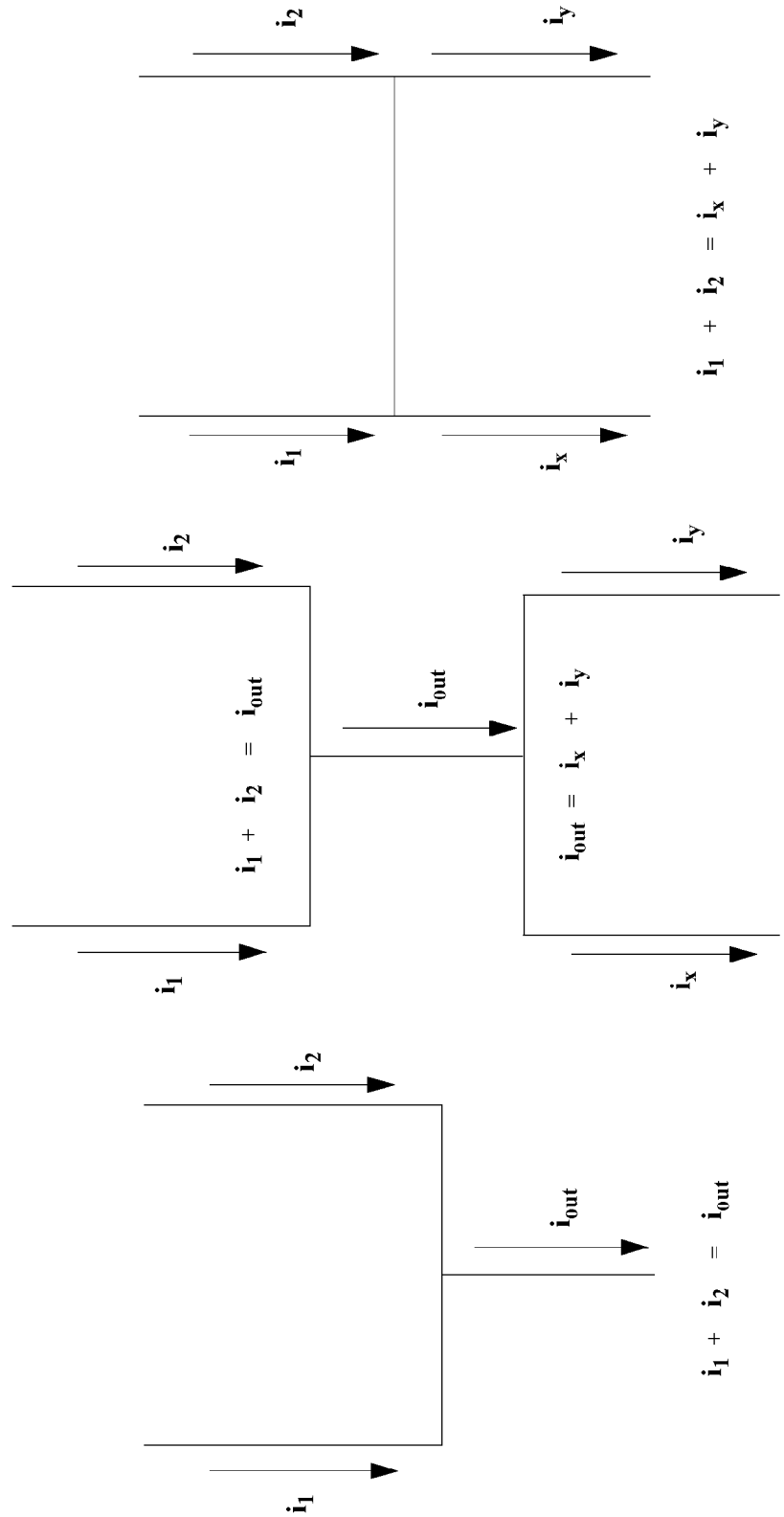

HIERACHICALLY-MODULAR NANOELECTRONIC DIFFERENTIAL AMPLIFIERS, OP AMPS, AND ASSOCIATED CURRENT SOURCES UTILIZING CARBON NANOTUBES, GRAPHENE NANORIBBONS, PRINTED ELECTRONICS, POLYMER SEMICONDUCTORS, OR OTHER RELATED MATERIALS

CROSS-REFERENCE TO RELATED APPLICATIONS

Pursuant to 35 U.S.C. §119(e), this application claims benefit of priority from Provisional U.S. Patent application Ser. No. 61/348,366, filed May 26, 2010, the contents of which are incorporated by reference.

COPYRIGHT & TRADEMARK NOTICES

A portion of the disclosure of this patent document may contain material, which is subject to copyright protection. Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

BACKGROUND OF THE INVENTION

The present invention generally relates to nanotechnology, and in particular, to differential amplifiers, current sources, and associated circuits created from carbon nanotubes, graphene nanoribbons and other related materials, and the associated use and synergies of these with carbon nanotube sensors, carbon nanotube actuators, and other nanoelectronic devices.

For carbon nanotube sensors and transducers, conventional consideration to interfacing to the larger-scale world of exogenous signal processing and control systems that would co-operate with these miraculous small devices is virtually or completely non-existent. One advantage of nanoscale molecular electronics (including carbon nanotube and graphene electronics) is that the degradation of signals and measurements due to thermal and other electrical noise can be highly reduced due in part to the smaller electron counts involved in nanoscale electronic device operation. However, with poor electrical interfacing to the larger-scale world, the valuable gifts and opportunities offered by the sensitivities and signal integrity of these nanoscale devices is easily (and perhaps literally) would otherwise be lost in the noise. The above comments can be extended to nanocomponents fabricated from other elongated semiconductor structures.

As a second observation, recognized benefits relate to signal conditioning, signal processing, and control electronics that are compatible with and complementary to the signal integrity of carbon nanotube sensors and transducers. In some circumstances such signal conditioning, signal processing, and control electronics would be purposed to work only with or within nanoscale devices (for example, a closed loop control system). In other circumstances such signal conditioning, signal processing, and control electronics would provide high-integrity interfacing between nanoscale devices and the larger-scale world of exogenous systems. The above comments can be extended to nanocomponents fabricated from other elongated semiconductor structures.

U.S. Pat. No. 7,858,918, entitled "Molecular Transistor Circuits Compatible with Carbon Nanotube Sensors and Transducers," among other things describes small-signal and other circuit design techniques that can be realized by carbon nanotube field-effect transistors (CNFETs) and other types of carbon-based transistors to create analog electronics for analog signal handling, analog signal processing, and conversions between analog signals and digital signals.

As CNFETs exist and operate at nanoscale, they can be readily collocated or integrated into carbon nanotube sensing and transducing systems. Such collocation and integration can be at, or adequately near, nanoscale. In exemplary arrangements, a number of CNFETS and other carbon nanotube components can be used in analog operating modes and can be consecutively interconnected to form a chain on the same semiconducting carbon nanotube. A semiconducting carbon nanotube can be draped over an array of interconnecting and/or interfacing electrodes and insulating layers (for example as used to form the gate element of a CNFET). Natively N-type semiconducting carbon nanotube material can be locally converted to P-type by extracting oxygen through spatially localized photolithographed regions and sealing the region with an oxygen-barrier sealing layer. In various embodiments, carbon nanotube sensors, actuators, and transducers can be directly incorporated into analog circuits realized on the same nanotube. The above comments can be extended to nanocomponents fabricated from other elongated semiconductor structures.

U.S. Pat. No. 7,838,809, entitled "Nanoelectronic Differential Amplifiers and Related Circuits Having Carbon Nanotubes, Graphene Nanoribbons, or Other Related Materials," among other things extends the electronics considerations further and with particular attention to the implementation of entire differential amplifiers on a single carbon nanotube, graphene nanoribbons, or other related materials. Optical interconnection systems and methods among circuit blocks, including the leverage of various types of isolation and multiplexing, are also taught. This patent and associated pending continuation applications also introduce the notions of "nanotube IP-cores" and "System-on-a-Nanotube" frameworks.

Pending U.S. Patent Application 61/217,535, entitled "Chain/Leapfrog Circuit Topologies and Tools for Printed Electronics, Carbon Nanotube/Grapheme Ribbon Nanoelectronics, and Their Confluences," among other things explicitly extends the above and related approaches to printed electronics and semiconducting polymers. It also includes approaches for using printed electronics, either directly or via interpretation or supplement with numerical models, to used printed electronics to prototype circuits (using at least the design approaches presented) realized with carbon nanotubes, graphene nanoribbons, semiconducting polymers, and other related materials at various physical implementation scales.

SUMMARY OF THE INVENTION

For purposes of summarizing, certain aspects, advantages, and novel features are described herein. Not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In an embodiment, a variety of exemplary alternate current sources for use as components in exemplary differential amplifiers and other circuits are structured so that they can be realized by, for example, elongated semiconducting structures such as carbon nanotubes, graphene nanoribbons, elongated structures of semiconducting polymers or organic semiconductors, other related materials, and printed electronics strips.

In an embodiment, methods are provided for implementing modular electronic circuits on elongated structures of semiconducting materials such as carbon nanotubes, graphene nanoribbons, elongated structures of semiconducting polymers or organic semiconductors, other related materials, and printed electronics strip structures.

In an embodiment, the methods provide for a plurality of such modular electronic circuits to be implemented on distinct adjacent portions of the same elongated structure of semiconducting materials.

In an implementation, a variety of powering arrangements for modules so that each module comprises a chain of electronic components arranged so that each end of the chain functions as a power supply terminal.

In an embodiment, a variety of exemplary alternate current sources for use as components in exemplary differential amplifiers and other circuits are structured so that they can be used as modules in conjunction with or as a component within larger circuits.

In an embodiment, the aforementioned exemplary differential amplifiers can be structured using pairs of current sources so they terminate in power supply terminals.

In an embodiment, the aforementioned exemplary differential amplifiers can be used as modules in conjunction with or as a component within larger circuits.

In an embodiment, the invention provides for modules to be used as components within other modules, thus hierarchical modularity.

In an embodiment, the invention provides for hierarchical modularity of an arbitrary number of levels.

In an embodiment, the invention provides for hierarchical modularity of an arbitrary number of depths.

In an embodiment, a variety of powering arrangements for modules is provided so that a number of modules can share the same carbon nanotube, graphene nanoribbon, elongated structure of semiconducting polymers or organic semiconductors, other related materials, and printed electronics strip structure.

In a Computer Aided Design (CAD) embodiment or implementation, designs for modular electronic circuits are stored and retrieved from a library of modular electronic circuit designs.

In an embodiment, these teachings provide an enhanced framework and detailed examples for "elongated-semiconductor IP-cores."

In an embodiment, these teachings provide an enhanced framework and detailed examples for "system-on-an-elongated-semiconductor" formalisms.

In an embodiment, the invention provides a method for modular implementation of analog electronic circuits on elongated semiconducting structures, the method comprising:

organizing an electronic circuit designed for insulated-gate field-effect transistors so that it comprises a linear sequence of at least insulated-gate field-effect transistors interconnected in a chain, the organization resulting in a chain-topology circuit, the circuit comprising at least an input, at least an output, and at least two terminals for receiving electrical power, modifying the chain-topology circuit so as to create a modified chain-topology circuit, the modified chain-topology circuit terminating at two chain endpoint electrical terminals, the modified chain-topology circuit arranged so both of the chain endpoint electrical terminals function as at least a power supply terminal, the resulting arrangement forming a modular chain electrical circuit comprising power-supply termination at each end of the two chain endpoint electrical terminals;

substituting the insulated-gate field-effect transistors with alternate field effect transistors, each alternate field effect transistor comprising a portion of an elongated semiconducting material, the portion in electrical contact with two electrically contacting electrodes and subject to the electric field of a third electrode situated between the two electrically contacting electrodes, the third electrode not in electrical contact with the portion, so that at least two alternate field effect transistors share an electrically contacting electrodes, and the modular chain electrical circuit is arranged to receive electrical power from at least the chain endpoint electrical terminals.

In an embodiment, the invention provides for each the two chain endpoint electrical terminals are configured to connect to different voltages.

In an embodiment, the invention provides for each of the two chain endpoint electrical terminals is configured to connect to essentially the same voltage.

In an embodiment, the invention provides for the modular chain electrical circuit further comprises at least one additional power supply terminal for receiving electrical power, the additional power supply terminal at a point in the modified chain-topology circuit situated between the two electrically contacting electrodes and distinct from the two electrically contacting electrodes.

In an embodiment, the invention provides for the additional power supply terminal is configured to connect to a different voltage than the two chain endpoint electrical terminals.

In an embodiment, the invention provides for the electronic circuit designed for insulated-gate field-effect transistors comprises at least one active load configuration.

In an embodiment, the invention provides for the active load configuration is selected from a collection of possible active load configurations, wherein the active load configurations is selected from a collection of active load configurations, the collection of active load configurations comprised within a library of electrical circuits applicable for implementation on at least a portion of an elongated semiconducting material.

In an embodiment, the invention provides for the electronic circuit designed for insulated-gate field-effect transistors comprises a first current source, the first current source comprising an associated electrical current output.

In an embodiment, the invention provides for the modification made to the chain-topology circuit so as to create modular chain electrical circuit comprises adding a second current source, the second current source comprising an associated electrical current output arranged to be electrically connected to the electrical current output of the first current source.

In an embodiment, the invention provides for the modification made to the chain-topology circuit so as to create modular chain electrical circuit further comprises locating the first current source at one end of the modular chain electrical circuit and locating the second current source at one end of the modular chain electrical circuit.

In an embodiment, the invention provides for the first electrical current source used is selected from a collection of possible electrical current sources, wherein the electrical current source is selected from a collection of electrical current sources, the collection of electrical current sources comprised within a library of electrical circuits applicable for implementation on at least a portion of an elongated semiconducting material.

In an embodiment, the invention provides for the electronic circuit designed for insulated-gate field-effect transistors comprises at least differential amplifier library.

In an embodiment, the invention provides for the modular chain electrical circuit comprises a differential amplifier.

In an embodiment, the invention provides for the modular chain electrical circuit used is selected from a collection of possible modular chain electrical circuits, wherein the modular chain electrical circuit is selected from a collection of modular chain electrical circuit s, the collection of modular chain electrical circuits comprised within a library of electrical circuits applicable for implementation on at least a portion of an elongated semiconducting material.

In an embodiment, the invention provides for the elongated semiconducting material used to implement the modular chain electrical circuit is also used to implement at least an additional modular chain electrical circuit, the additional modular chain electrical circuit implemented on a portion of the elongated semiconducting material.

In an embodiment, the invention provides for the additional modular chain electrical circuit used is selected from a collection of possible modular chain electrical circuits, wherein the modular chain electrical circuit is selected from a collection of modular chain electrical circuits, the collection of modular chain electrical circuits comprised within a library of electrical circuits applicable for implementation on at least a portion of an elongated semiconducting material.

In an embodiment, the invention provides for the portion of the elongated semiconducting material used to implement the modular chain electrical circuit is directly adjacent to the portion of the elongated semiconducting material used to implement the additional modular chain electrical circuit.

In an embodiment, the invention provides for a chain endpoint electrical terminal of the modular chain electrical circuit shares an electrode with a chain endpoint electrical terminal of the additional modular chain electrical circuit.

In an embodiment, the invention provides for an output of the modular chain electrical circuit is connected to an input of the additional modular chain electrical circuit.

In an embodiment, the invention provides for the modular chain electrical circuit and additional modular chain electrical circuit are both differential amplifiers, and the resulting connected modular chain electrical circuit and additional modular chain electrical circuit comprises at least portion of an operational amplifier.

BRIEF DESCRIPTION OF THE DRAWINGS

The above and other aspects, features and advantages of the present invention will become more apparent upon consideration of the following description of preferred embodiments taken in conjunction with the accompanying drawing figures.

FIG. 7a depicts an instance of Kirchoff's current law for a "Y" topology connection of three conductors.

FIG. 7b depicts two concatenated instances of the "Y" topology of FIG. 7a.

FIG. 7c depicts an instance of Kirchoff's current law for an "H" topology connection of four conductors arranged in two pairs linked by a bridge.

DETAILED DESCRIPTION OF THE PREFERRED EMBODIMENTS

Figure 1A:
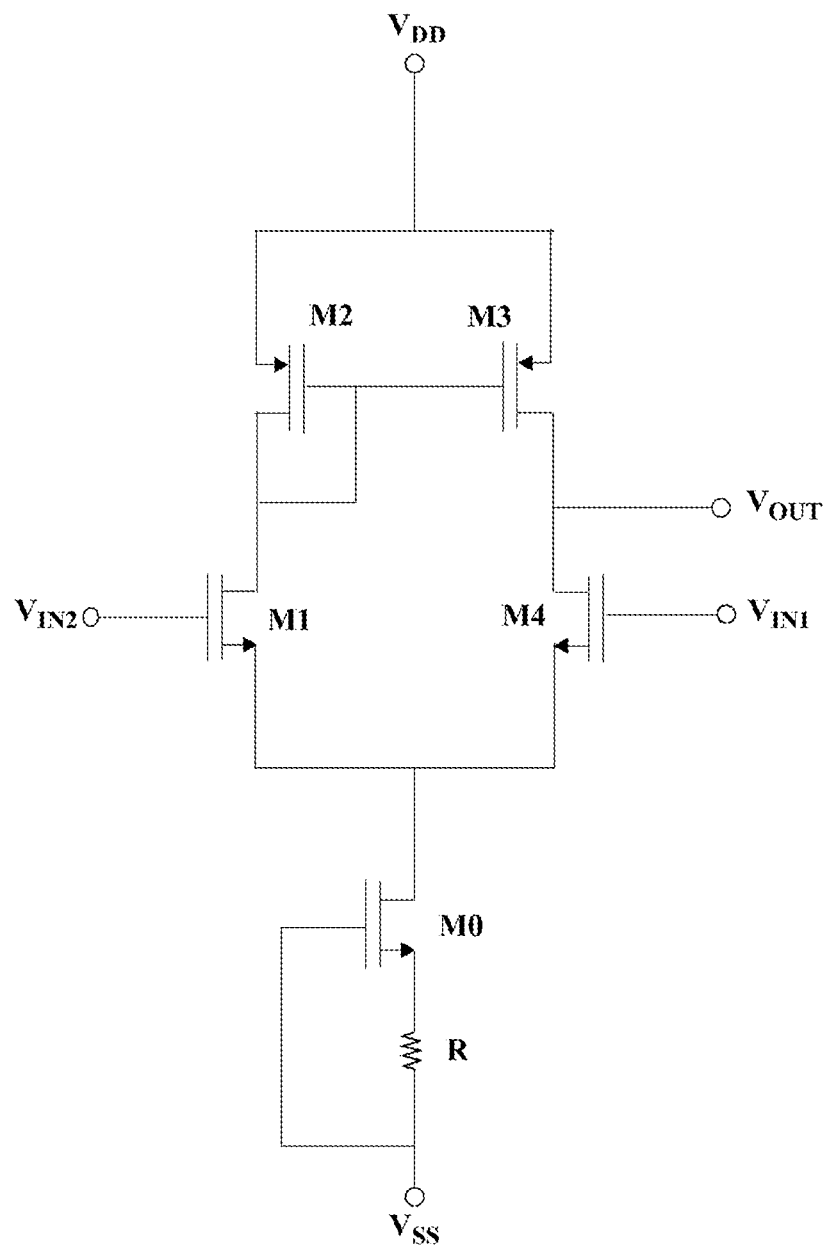
FIG. 1a depicts an exemplary FET differential amplifier circuit featuring an example current source involving a resistor.

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

In the following description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention.

For carbon nanotube and other nanotechnology sensors and transducers, conventional consideration to interfacing to the larger-scale world of exogenous signal processing and control systems that would co-operate with these miraculous small devices is virtually or completely non-existent. One advantage of nanoscale molecular electronics (including carbon nanotube electronics) is that the degradation of signals and measurements due to thermal and other electrical noise is highly reduced due in part to the smaller electron counts involved in nanoscale electronic device operation. With poor interfacing to the larger-scale world, the valuable gifts and opportunities offered by the sensitivities and signal integrity of these nanoscale devices is easily (and perhaps literally) would otherwise be lost in the noise.

As a second observation, recognized benefits relate to signal conditioning, signal processing, and control electronics that are compatible with and complementary to the signal integrity of carbon nanotube sensors and transducers. In some circumstances such signal conditioning, signal processing, and control electronics would be purposed to work only with nanoscale devices. In other circumstances such signal conditioning, signal processing, and control electronics would provide high-integrity interfacing between nanoscale devices and the larger-scale world of exogenous systems.

U.S. Pat. No. 7,858,918, entitled "Molecular Transistor Circuits Compatible with Carbon Nanotube Sensors and Transducers," among other things describes small-signal and other circuit design techniques that can be realized by carbon nanotube field-effect transistors (CNFETs) to create analog electronics for analog signal handling, analog signal processing, and conversions between analog signals and digital signals. As the CNFETs exist and operate at nanoscale, they can be readily collocated or integrated into carbon nanotube sensing and transducing systems. Such collocation and integration can be at, or adequately near, nanoscale. In exemplary arrangements, a number of CNFETS and other carbon nanotube components can be used in analog operating modes and can be consecutively interconnected to form a chain on the same semiconducting carbon nanotube. A semiconducting carbon nanotube can be draped over an array of interconnecting and/or interfacing electrodes and insulating layers (for example as used to form the gate element of a CNFET). Natively N-type semiconducting carbon nanotube material can be locally converted to P-type by extracting oxygen through spatially localized photolithographed regions and sealing the region with an oxygen-barrier sealing layer. In various embodiments, carbon nanotube sensors, actuators, and transducers can be directly incorporated into analog circuits realized on the same nanotube.

U.S. Pat. No. 7,838,809, entitled "Nanoelectronic Differential Amplifiers and Related Circuits Having Carbon Nanotubes, Graphene Nanoribbons, or Other Related Materials," among other things extends the electronics considerations further and with particular attention to the implementation of entire differential amplifiers on a single carbon nanotube, graphene nanoribbons, or other related materials. Optical interconnection systems and methods among circuit blocks, including the leverage of various types of isolation and multiplexing, are also taught. This patent application also taught the notion of "nanotube IP-cores" and "System-on-a-Nanotube" frameworks.

Pending U.S. Patent Application 61/217,535, entitled "Chain/Leapfrog Circuit Topologies and Tools for Printed Electronics, Carbon Nanotube/Grapheme Ribbon Nanoelectronics, and Their Confluences," among other things explicitly extends these approaches to printed electronics and semiconducting polymers. It also develops approaches for using printed electronics, either directly or via interpretation or supplement with numerical models, to used printed electronics to prototype circuits (using at least the design approaches presented) realized with carbon nanotubes, graphene nanoribbons, semiconducting polymers, and other related materials at various physical implementation scales.

The present application is directed to further modularizing the approaches of the aforementioned patents and patent application. First, a variety of exemplary alternate current sources for use as components in exemplary differential amplifiers and other circuits are structured so that they can be:
  realized by carbon nanotubes, graphene nanoribbons, elongated structures of semiconducting polymers or organic semiconductors, other related materials, and printed electronics strips; and
  used as modules in conjunction with or as a component within larger circuits.

Additionally, the present application teaches how a variety of various exemplary differential amplifiers can be:
  structured using pairs of current sources so they terminate in power supply terminals; and
  used as modules in conjunction with or as a component within larger circuits.

Further, the present application teaches a variety of powering arrangements for modules so that a number of these modules can share the same carbon nanotubes, graphene nanoribbons, elongated structures of semiconducting polymers or organic semiconductors, other related materials, and printed electronics strip structures.

Overall, these teachings provide an enhanced framework and detailed examples for the "elongated-semiconductor IP-cores" and "system-on-an-elongated-semiconductor" teachings provided in U.S. Pat. No. 7,838,809, further facilitating the "nanotube IP-core" products for a "system-on-a-Nanotube" marketplace teachings provided in U.S. Pat. No. 7,838,809.

To begin, a brief review is first provided of a few representative concepts from U.S. Pat. Nos. 7,858,918, 7,838,809, and pending U.S. Patent Application 61/217,535. Although the review above is largely presented in the context of carbon nanotubes, as taught in U.S. Pat. Nos. 7,858,918, 7,838,809, and pending U.S. Patent Application 61/217,535 the same principles apply when replacing the carbon nanotubes with graphene nanoribbons, semiconducting polymers or organic semiconductors, and other related materials at various physical implementation scales.

FIG. 1a depicts an exemplary differential amplifier circuit implemented with insulated gate field-effect transistors (such as MOSFETs), more specifically comprising a current source (M0, R) and a differential amplifier ladder (M1-M4). It is noted that other types of current source circuits can be used, including those described later. Transistors used in the configuration of M2 are commonly called "active loads." Note the gate voltage of M2 is determined by the drain voltage of M2. Accordingly the interconnected arrangement of M2 and M3 form a current mirror wherein the current at the drain of M3 nearly matches the current at the drain of M2 (since the gate voltage of M3 is the same as the gate voltage of M2). Such an arrangement is commonly used to replace traditional load resistors in a differential amplifier design, and is traditionally employed in FET operational amplifiers ("op amps") and other types of integrated circuit components made from silicon. Such active load/current mirror circuits are familiar to one skilled in the art of monolithic operation amplifiers.

Figure 1B:
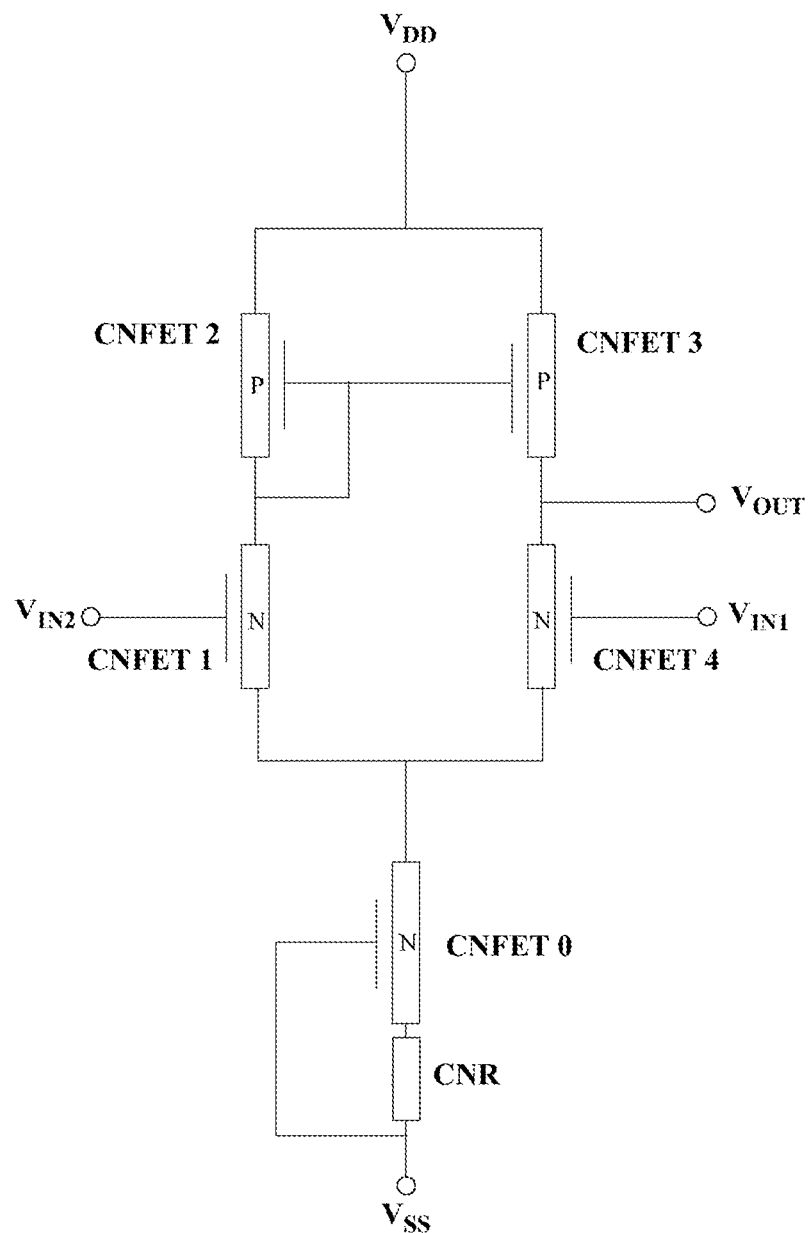
FIG. 1b depicts an adaptation of the circuit of FIG. 1a wherein CNFETs (or other field-effect transistor fabricated on a portion of elongated semiconducting material) of appropriate complementary types (N-type and P-type) replace the corresponding insulated gate transistors (such as MOSFETs) and use of a carbon nanotube resistor (CNR) or other form of resistor fabricated on a portion of elongated semiconducting material.

As described in U.S. Pat. Nos. 7,858,918 and 7,838,809, carbon nanotube FETS (CNFETs) exhibit operational curves with viable analog amplification ranges not unlike those of conventional insulated gate field-effect transistors (such as MOSFETs). Exploiting this as described in U.S. Pat. Nos. 7,858,918 and 7,838,809, FIG. 1b depicts an adaptation of the circuit of FIG. 1a wherein CNFETs (or other insulated gate field-effect transistor implemented on a portion of a elongated semiconductor) of appropriate complementary types (N-type and P-type) replace the corresponding insulated gate field-effect transistors (such as MOSFETs), and a Carbon Nanotube Resistor (CNR) or other form of resistor fabricated on a portion of elongated semiconducting material replaces the resistor R in the example current source. It is noted that other types of current source circuits can be used, including those described later.

Figure 1C:
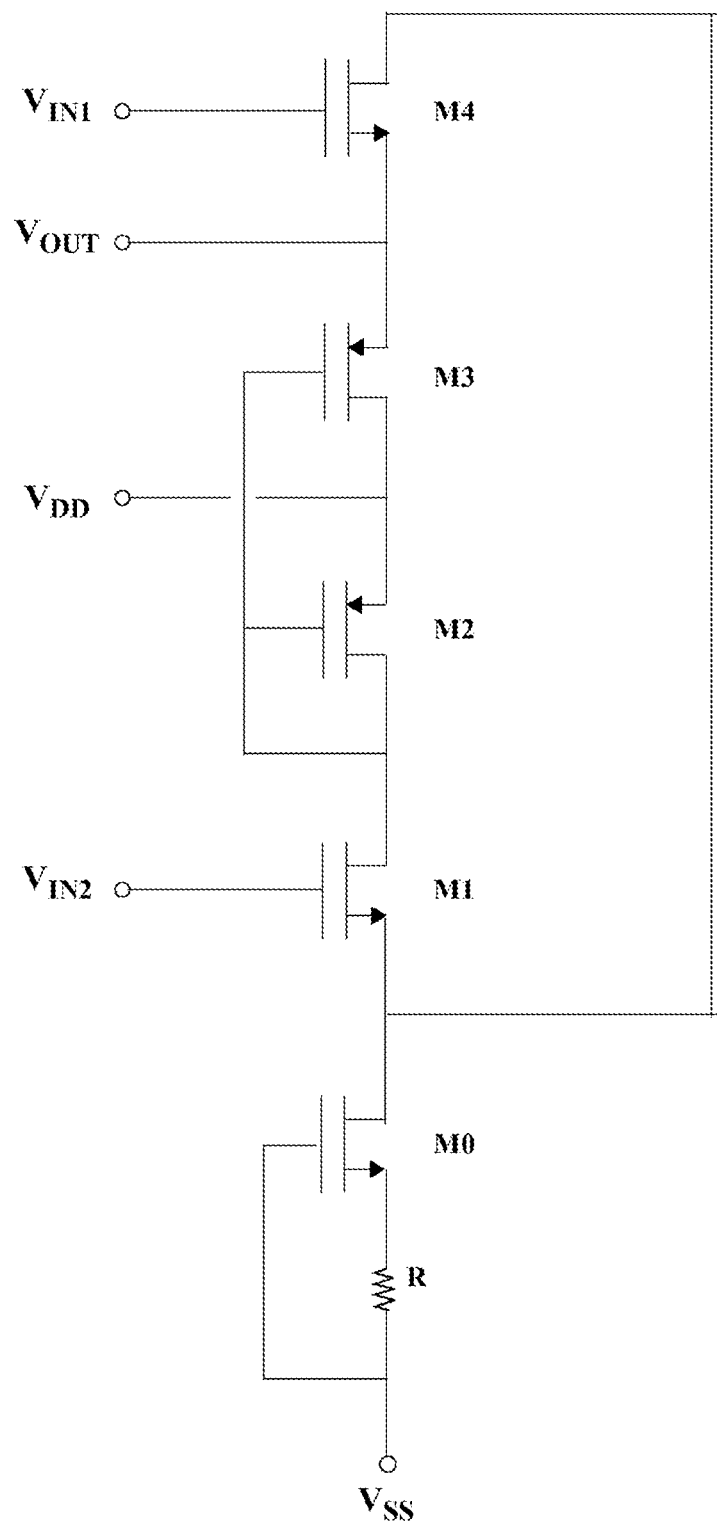
FIG. 1c depicts an arrangement of the differential amplifier circuit of FIG. 1a wherein the layout has been adapted to sequence the location of the devices into a chain of electronic components whose geometrically-extreme terminal locations are directly interconnected.
Figure 1D:
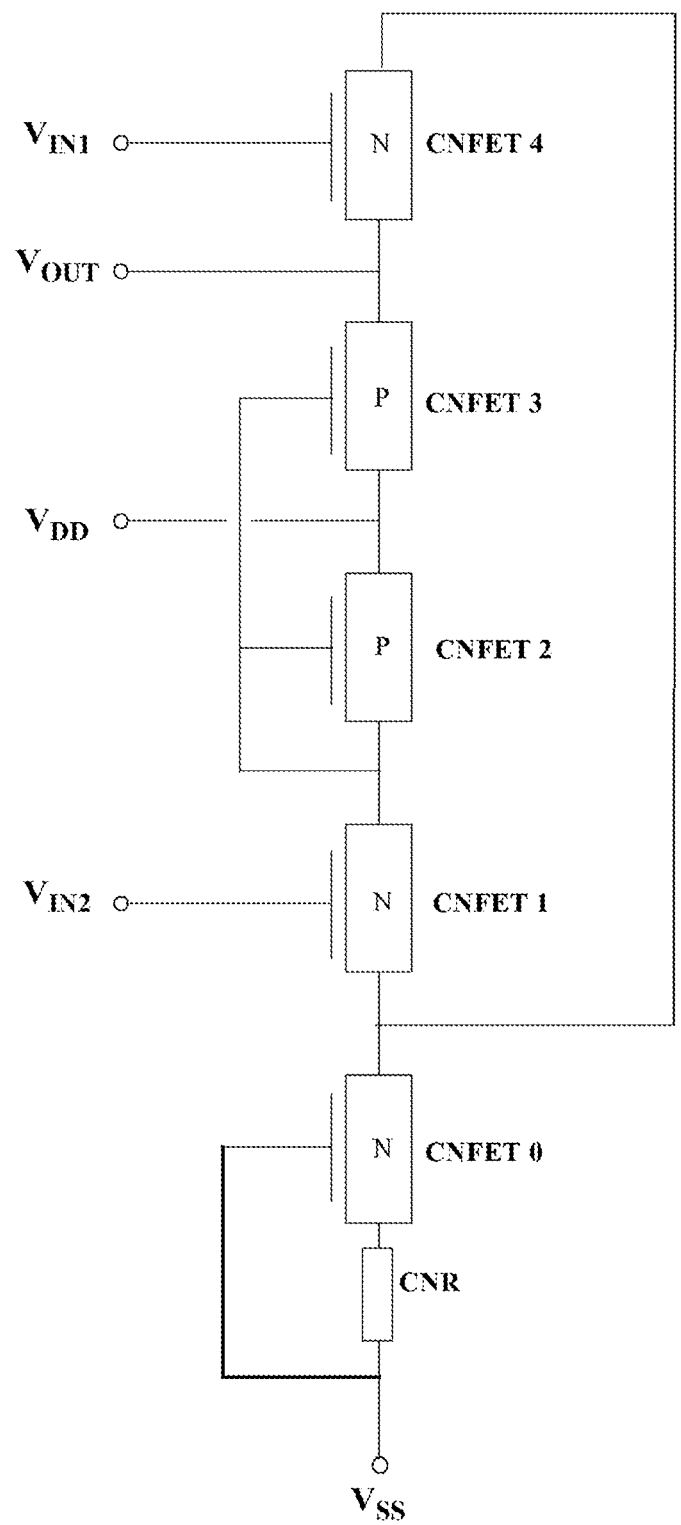
FIG. 1d depicts an adaptation of FIG. 1c wherein CNFETs (or other insulated gate field-effect transistor implemented on a portion of an elongated semiconductor) of appropriate complementary types (N-type and P-type) replace the corresponding insulated gate field-effect transistors (such as MOSFETs).

As taught in U.S. Pat. Nos. 7,858,918 and 7,838,809, FIG. 1c depicts an arrangement of the differential amplifier circuit of FIG. 1a wherein the layout has been adapted to sequence the location of the devices into a chain of electronic components whose geometrically-extreme terminal locations are directly interconnected. As taught in U.S. Pat. Nos. 7,858,918 and 7,838,809, FIG. 1d depicts an adaptation of FIG. 1c wherein CNFETs (or other insulated gate field-effect transistors implemented on a portion of a elongated semiconductor) of appropriate complementary types (N-type and P-type) replace the corresponding insulated gate field-effect transistors (such as MOSFETs).

Figure 2A:
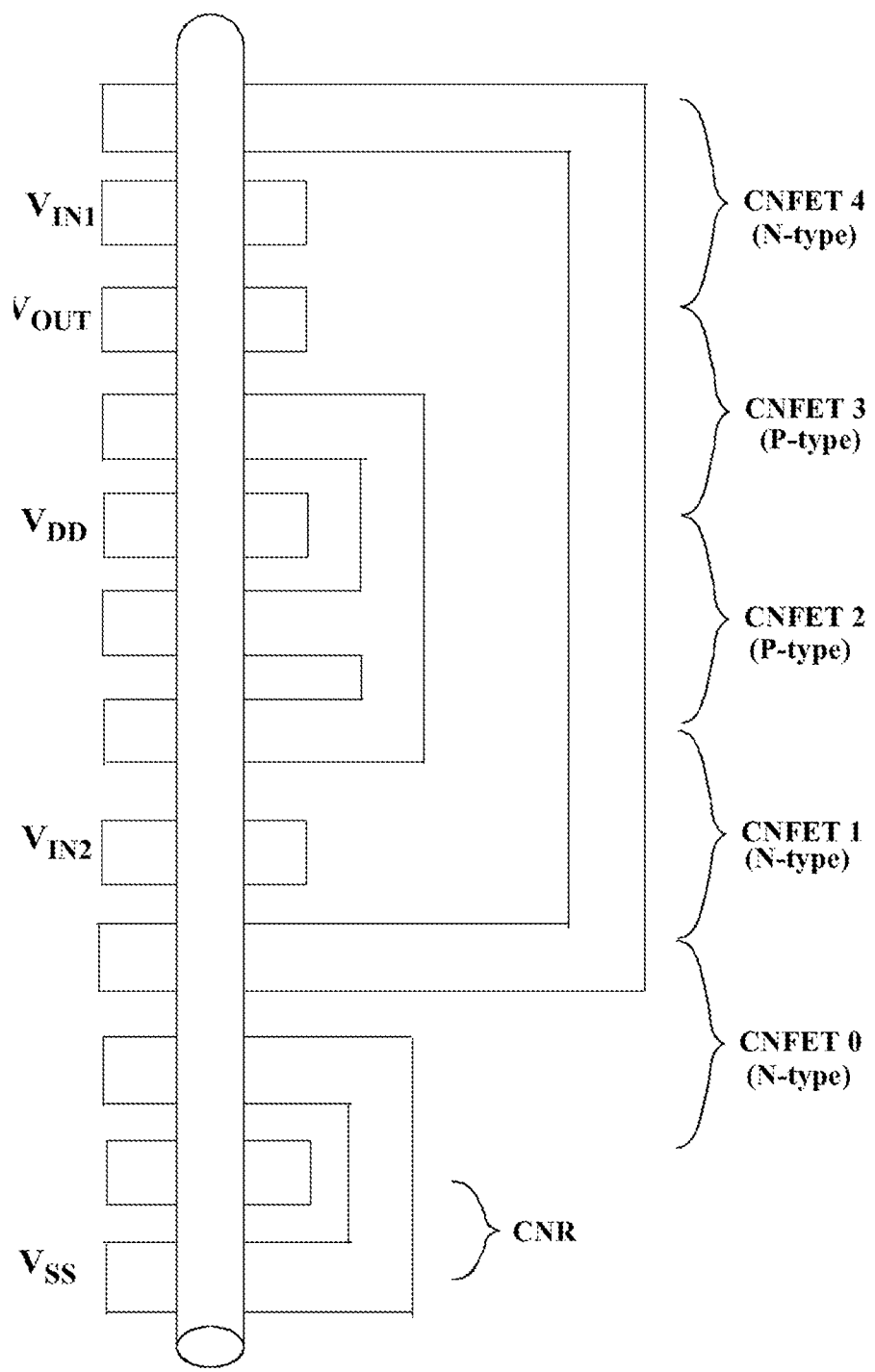
FIG. 2a depicts an exemplary electrode layout and associated nanotube (or other elongated semiconductor structure) positioning for single carbon nanotube (or other elongated semiconductor structure) implementation of the differential amplifier circuit of FIG. 1b as taught in U.S. Pat. No. 7,838,809.
Figure 2B:
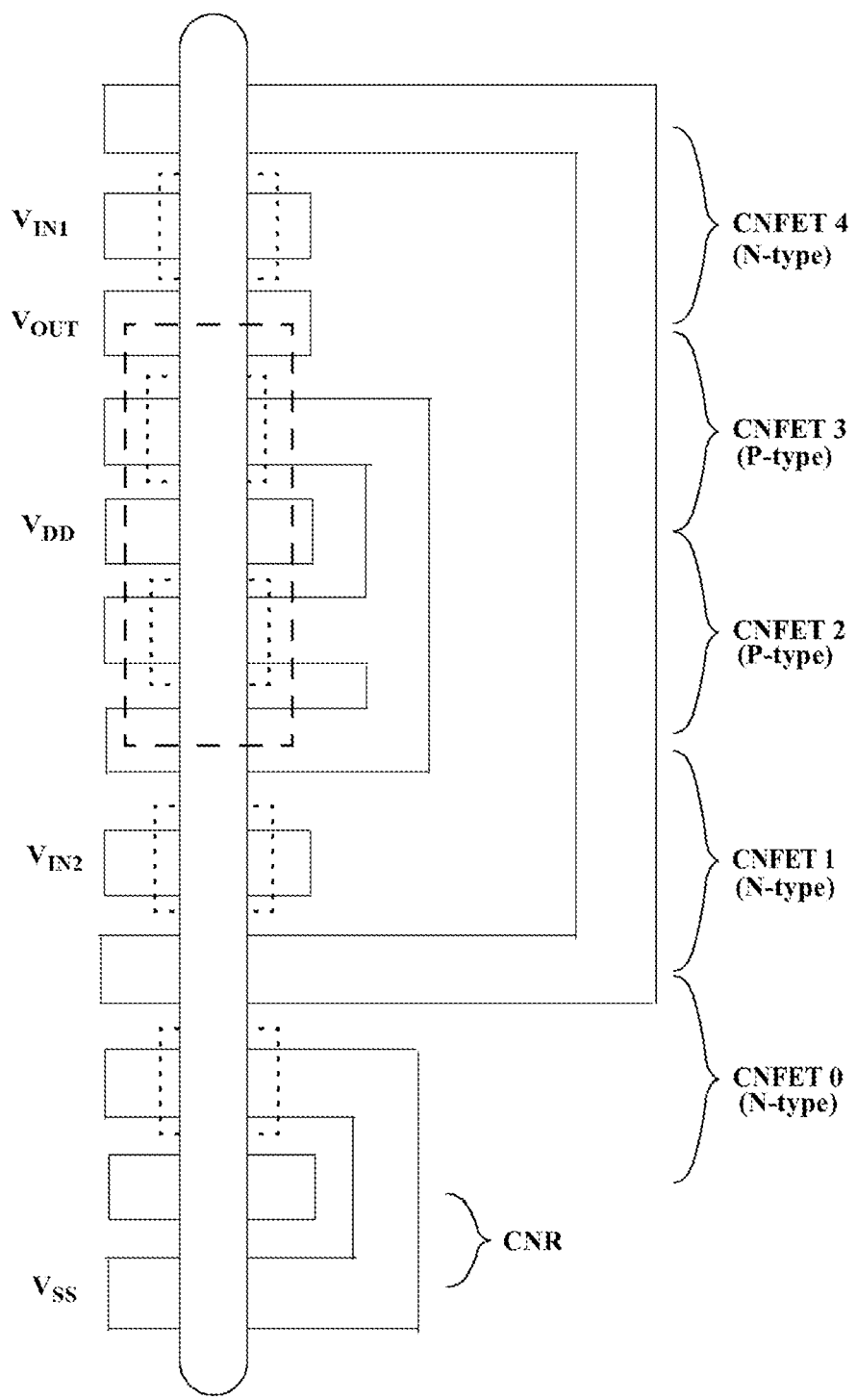
FIG. 2b depicts an exemplary physical single carbon nanotube (or other elongated semiconductor structure) implementation of the differential amplifier circuit of 2a, depicting field-effect transistor gate insulation layers (smaller dashed-line boxes) for each field-effect transistor as well as oxygen-blocking sealing layers (larger dashed-line boxes) for each P-type CNFET (or other insulated gate field-effect transistor implemented on a portion of an elongated semiconductor).

As taught in U.S. Pat. Nos. 7,858,918 and 7,838,809, FIG. 2a depicts an exemplary electrode layout and associated nanotube (or other elongated semiconductor structure) positioning for a single carbon nanotube (or other elongated semiconductor structure) implementation of the differential amplifier circuit of FIG. 1b. As taught in U.S. Pat. Nos. 7,858,918 and 7,838,809, FIG. 2b depicts an exemplary physical single carbon nanotube (or other insulated gate field-effect transistor implemented on a portion of a elongated semiconductor) implementation of the differential amplifier circuit of 2a, depicting insulation layers (smaller dashed-line boxes) for each transistor as well as oxygen-blocking sealing layers (larger dashed-line boxes) for each P-type CNFET (or other insulated gate field-effect transistor implemented on a portion of a elongated semiconductor).

Figure 3:
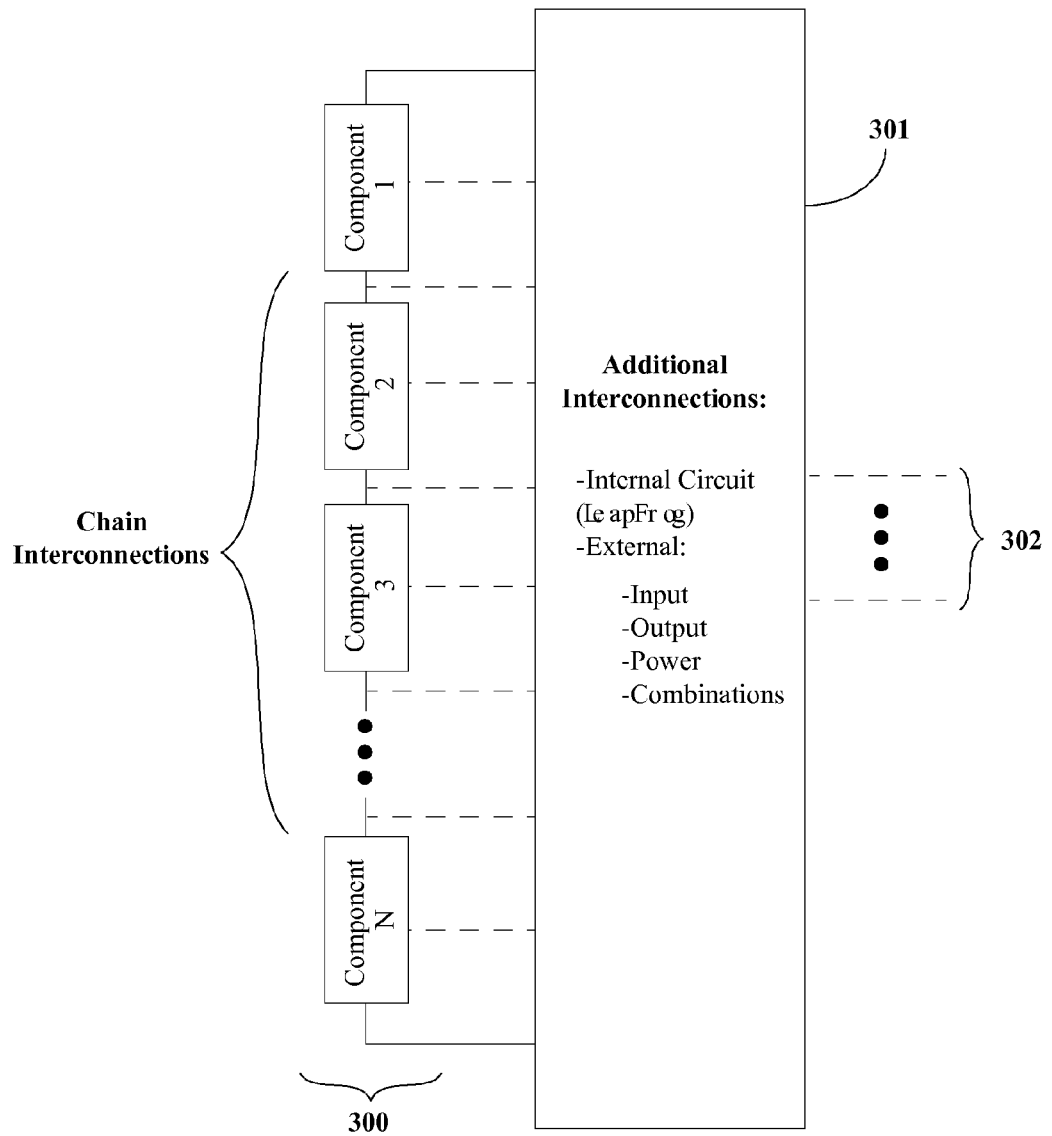
FIG. 3 depicts exemplary circuit topologies and other structures pertaining to principles and aspects of the invention.

FIG. 3, adapted from pending U.S. Patent Application 61/217,535, depicts exemplary circuit topologies and other structures pertaining to principles and aspects of the invention. As described therein, one aspect of the inventions of U.S. Pat. Nos. 7,858,918 and 7,838,809 is the leveraging of circuit topologies that comprise a physical chain of consecutively electrically interconnected components. In the figure, component 1, component 2, through component N can be two-terminal, three-terminal, or higher-terminal count devices. Component 1 and component 2 through component N are consecutively interconnected via extremal-positioned device terminals to form a chain 300. The beginning and ending of the chain, as well as potentially other selected terminals of the components, are also interconnected via interconnection conductors 301 with one or both of:

internally among themselves (with topological "leap-frog" paths);
    externally 302 to one or more of:
        circuit inputs;
        circuit outputs;
        circuit power;
        combinations of two or more of these.

This concludes the brief review is first provided of a few representative concepts from U.S. Pat. Nos. 7,858,918, 7,838,809, and pending U.S. Patent Application 61/217,535.

In the discussions above and to follow, although the systems and methods are presented largely in the context of carbon nanotubes, the same principles apply when replacing the carbon nanotubes with any one or more of elongated semiconducting structures such as graphene nanoribbons, semiconducting polymers or organic semiconductors, and other related materials at various physical implementation scales. This is due to inheritance of field-effect transistor operation Also in the discussions to follow, although circuit inputs are presented largely in the context of electrical signals, the invention provides for at least one circuit input to comprise other types of signals. For example, a given electrical-input input transistor can be alternatively substituted with an optical-sensing transistor (phototransistor), optical-sensing diode (photodiode), or other photo-responsive electrical component that can be fabricated using a portion of carbon nanotube or other elongated semiconducting structure. Such techniques are taught in U.S. Pat. Nos. 7,858,918, 7,838,809. As another example, a given electrical-input input transistor can be alternatively substituted with an affinity field effect transistor structure comprising a suitably responsive biomolecule suitably attached to the gate of a field-effect transistor fabricated using a portion of carbon nanotube or other elongated semiconducting structure. Such techniques are also taught in U.S. Pat. Nos. 7,858,918, 7,838,809. In a similar fashion, various other types of nanoscale sensors can be used in place of a given electrical-input input transistor.

Further in the discussions to follow, although circuit outputs are presented largely in the context of electrical signals, the invention provides for at least one circuit output to comprise other types of signals. For example, a given active load transistor can be alternatively substituted with a light-emitting transistor, light-emitting diode (photodiode), or other light-emitting electrical component that can be fabricated using a portion of carbon nanotube or other elongated semiconducting structure. Such techniques are taught in U.S. Pat. Nos. 7,858,918, 7,838,809. As another example, a given electrical-input input transistor can be alternatively substituted with an electrically-powered actuator arrangement using a portion of carbon nanotube or other elongated semiconducting structure. Such techniques are also taught in U.S. Pat. Nos. 7,858,918, 7,838,809.

Yet further in the discussions to follow, although examples are provided in terms of various types of differential amplifiers, active loads, current mirrors, current sources, and related circuits, in general the systems and methods described apply in general to adapting an electronic circuit designed for insulated gate field-effect transistors so that it comprises a linear sequence of at least insulated gate transistors interconnected in a chain topology so that each consecutive pair of electrical components in the chain share an electrical terminal, and further modifying the chain-topology circuit so as to create a modified chain-topology circuit is arranged so both of the chain endpoint electrical terminals function as at least a power supply terminal, the resulting arrangement forming a modular chain electrical circuit comprising power-supply termination at each end of the two chain endpoint electrical terminals.

Figure 4A:
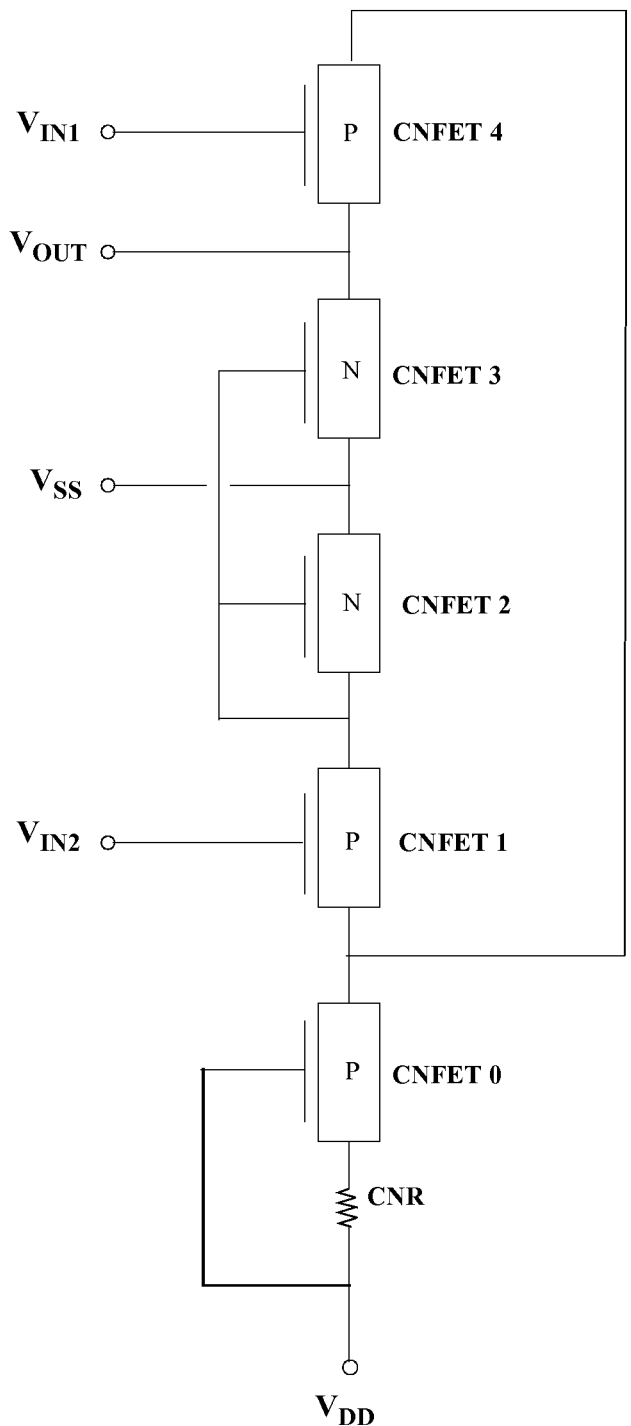
FIG. 4a depicts the complementary variation of FIG. 1d wherein N-type and P-type CNFETs (or other insulated gate field-effect transistors implemented on a portion of an elongated semiconductor) are swapped along with the swapping of positive and negative voltage supplies.
Figure 4B:
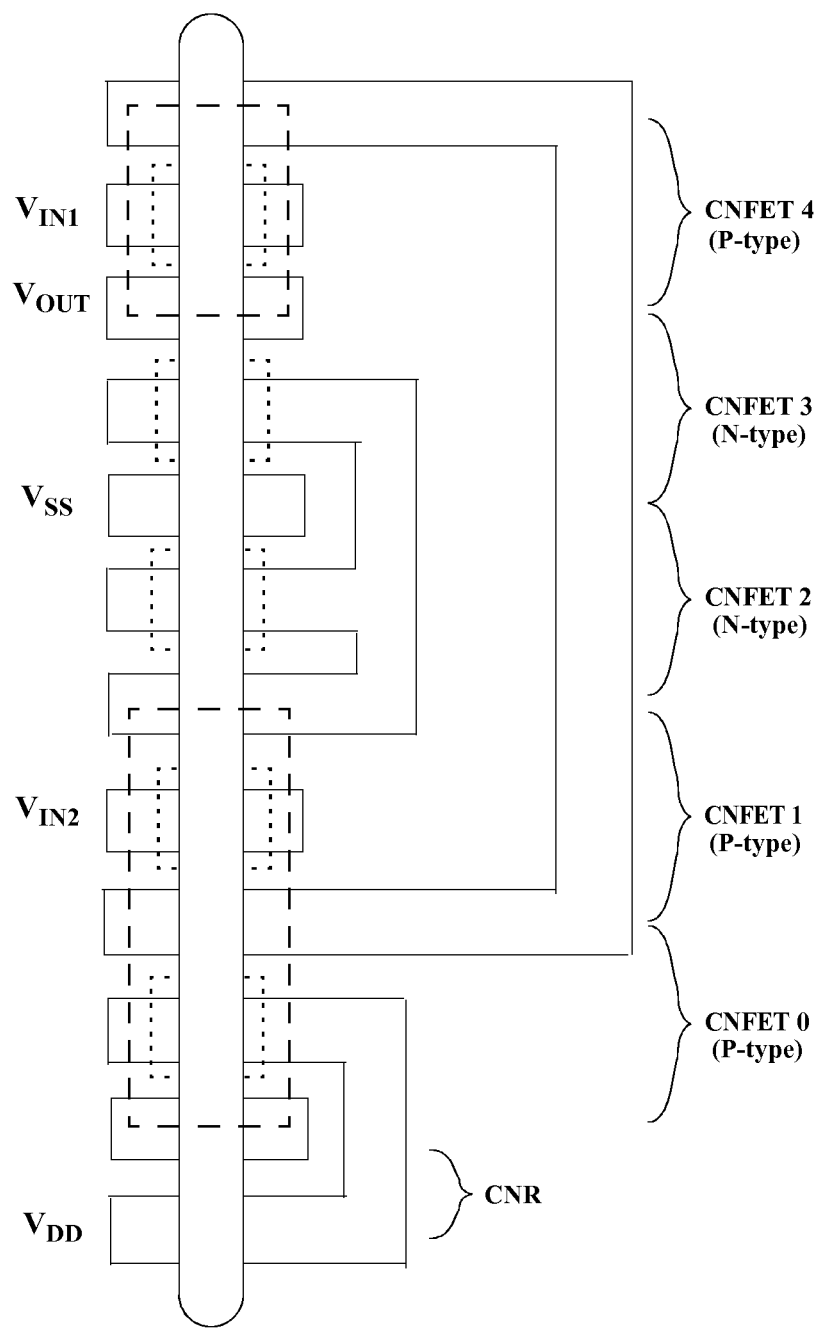
FIG. 4b depicts an exemplary single carbon nanotube (or other elongated semiconductor structure) implementation of the differential amplifier circuit of FIG. 4 comprising gate insulation layers (smaller dashed-line boxes) for each insulated-gate transistor as well as oxygen-blocking sealing layers (larger dashed-line boxes) for each P-type insulated-gate field-effect transistor.

Adding another example to the above example of FIG. 1d, FIG. 4a depicts the complementary variation of FIG. 1d wherein N-type and P-type CNFETs (or other insulated gate field-effect transistors implemented on a portion of a elongated semiconductor) are swapped along with the swapping of positive and negative voltage supplies. This arrangement provides an alternative powering, component polarity, and in many cases altered usable input voltage ranges that make it useful as an available modular element in larger systems designs. FIG. 4b depicts an exemplary single carbon nanotube (or other elongated semiconductor structure) implementation of the differential amplifier circuit of FIG. 4a comprising gate insulation layers (smaller dashed-line boxes) for each transistor as well as oxygen-blocking sealing layers (larger dashed-line boxes) for each P-type CNFET (or other insulated gate field-effect transistor implemented on a portion of an elongated semiconductor).

Figure 5A:
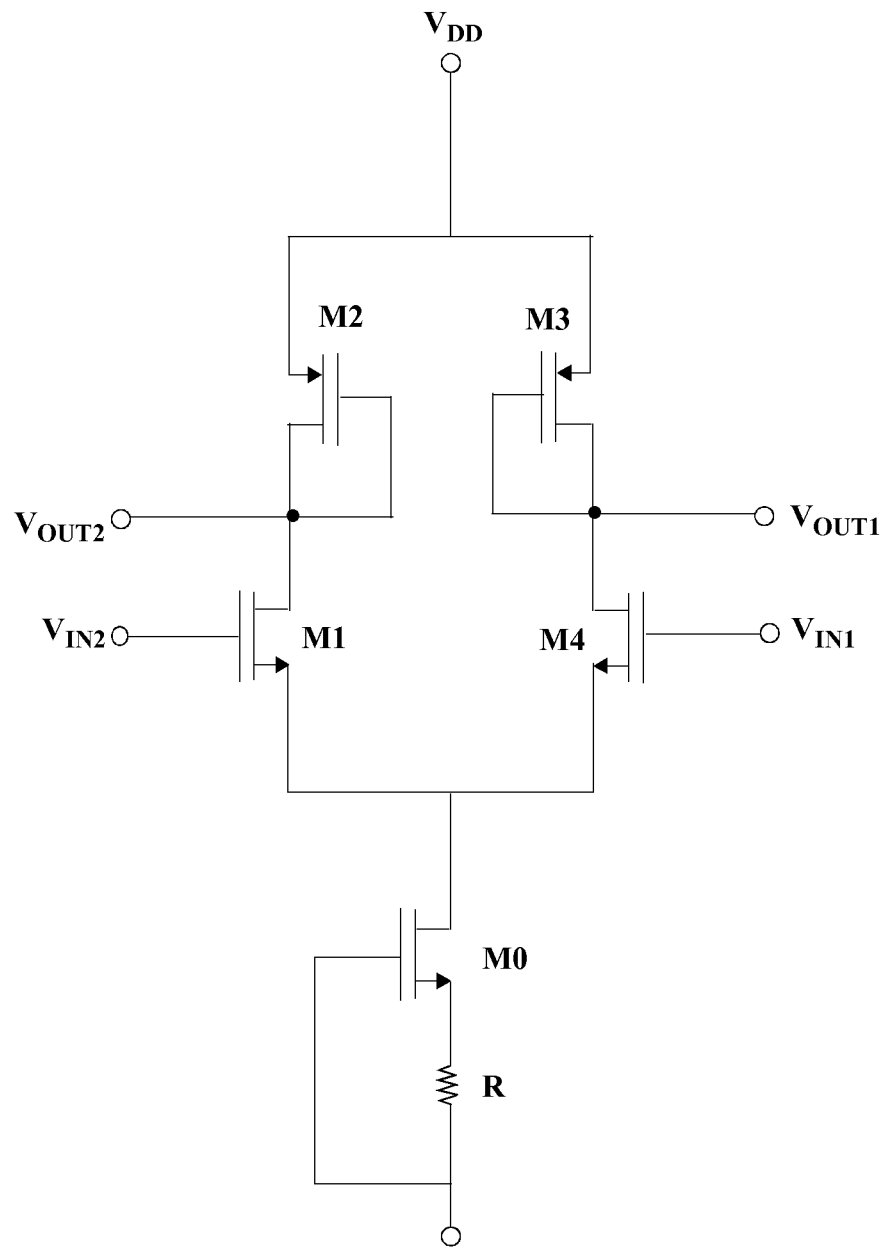
FIG. 5a depicts an exemplary differential output version of the insulated gate field-effect transistor (such as MOSFET) differential amplifier circuit of FIG. 1a wherein the active load/current arrangement of FIG. 1a is replaced by two independent active loads.
Figure 5B:
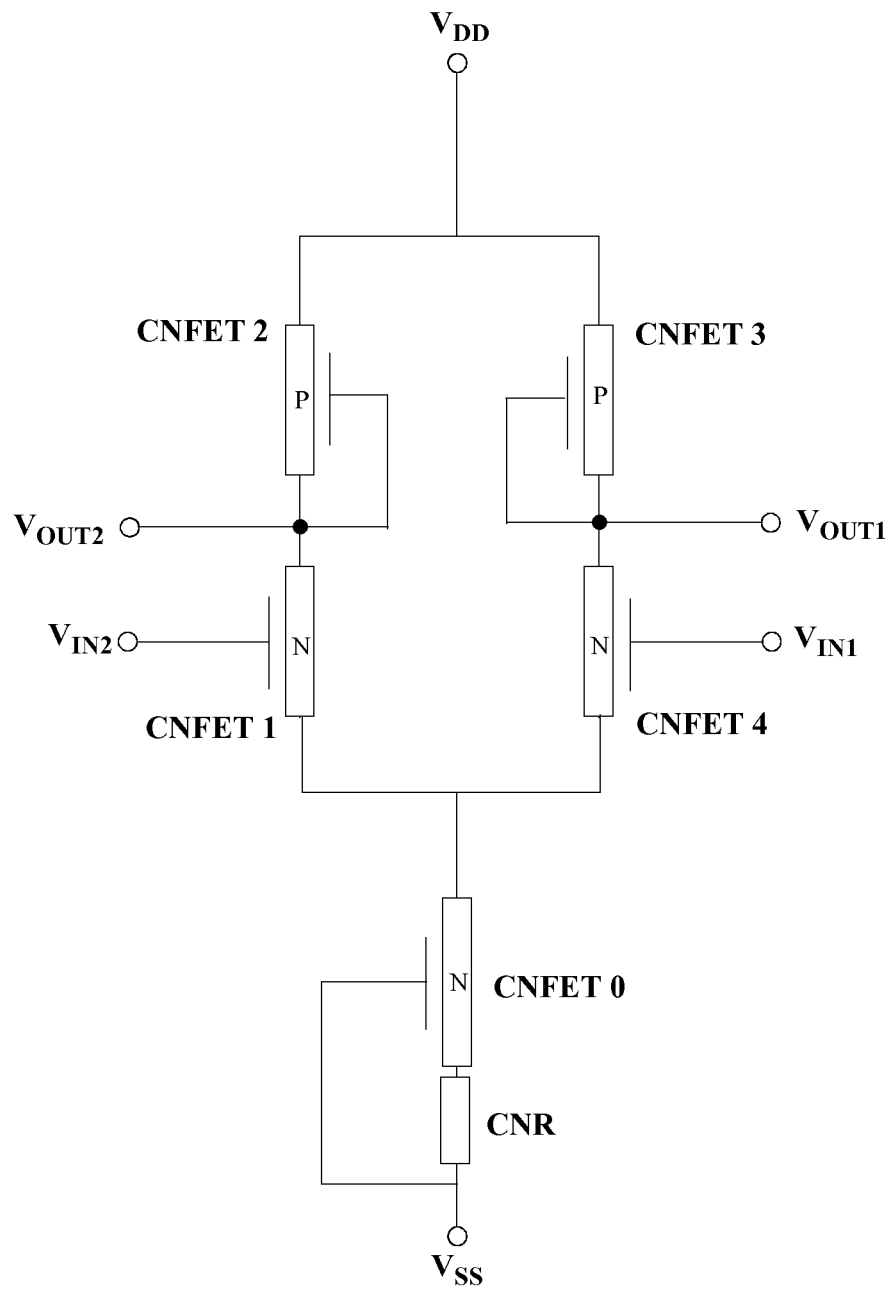
FIG. 5b depicts an adaptation of the circuit of FIG. 5a wherein CNFETs (or other insulated gate field-effect transistor implemented on a portion of an elongated semiconductor) of appropriate complementary types (N-type and P-type) replace the corresponding insulated gate field-effect transistors (such as MOSFETs).
Figure 5C:
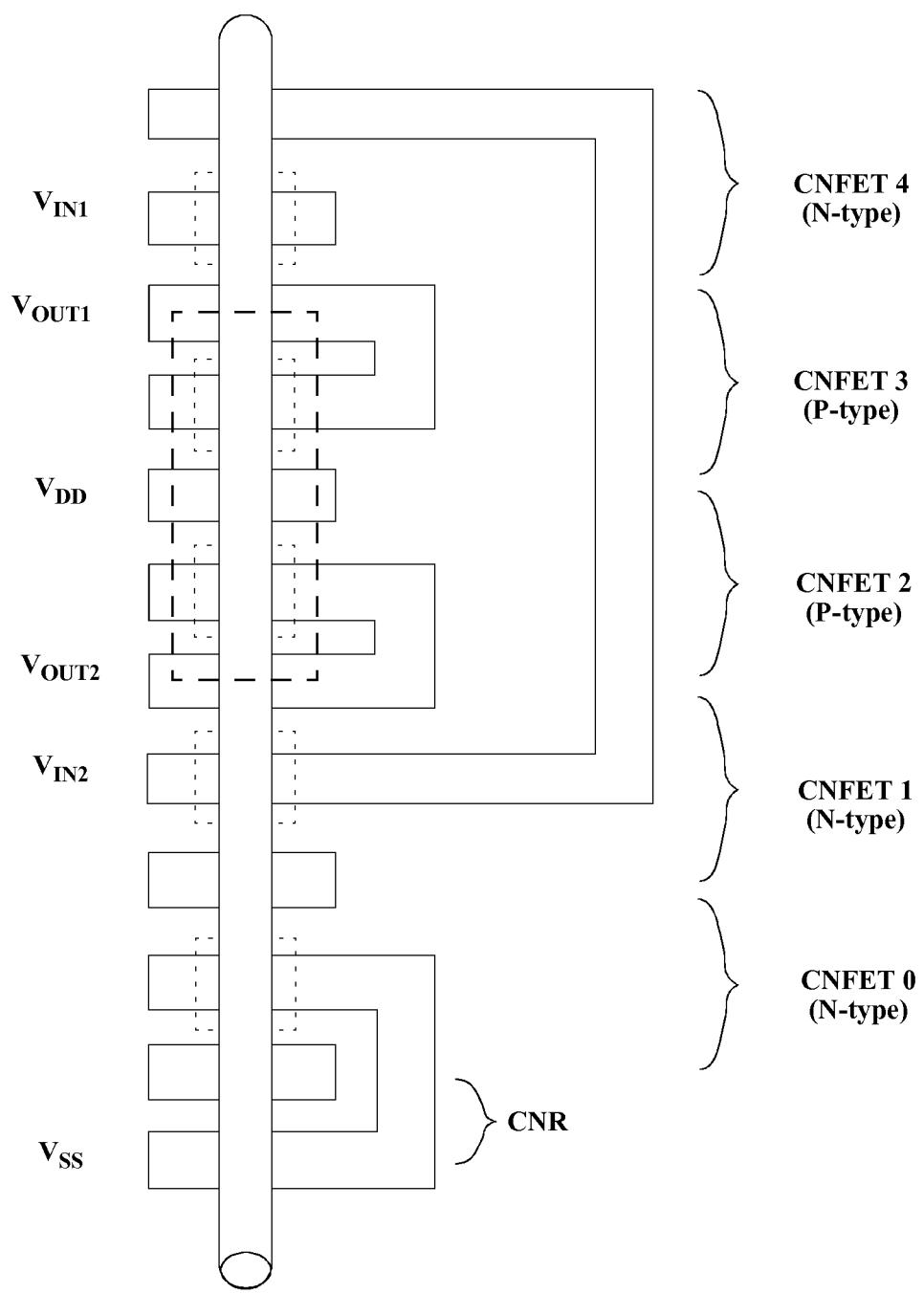
FIG. 5c depicts an exemplary single carbon nanotube (or other elongated semiconductor structure) implementation of the differential output differential amplifier circuit of FIG. 5b.

Adding to the two above examples with yet another example, FIG. 5a depicts an exemplary differential output version of the insulated gate field-effect transistor (such as MOSFET) differential amplifier circuit of FIG. 1a wherein the active load/current arrangement of FIG. 1a is replaced by two independent active loads. Accordingly, FIG. 5b depicts an adaptation of the circuit of FIG. 5a wherein CNFETs (or other insulated gate field-effect transistors implemented on a portion of a elongated semiconductor) of appropriate complementary types (N-type and P-type) replace the corresponding insulated gate field-effect transistors (such as MOSFETs), and FIG. 5c depicts an exemplary single carbon nanotube (or other elongated semiconductor structure) implementation of the differential output differential amplifier circuit of FIG. 5b.

Figure 6:
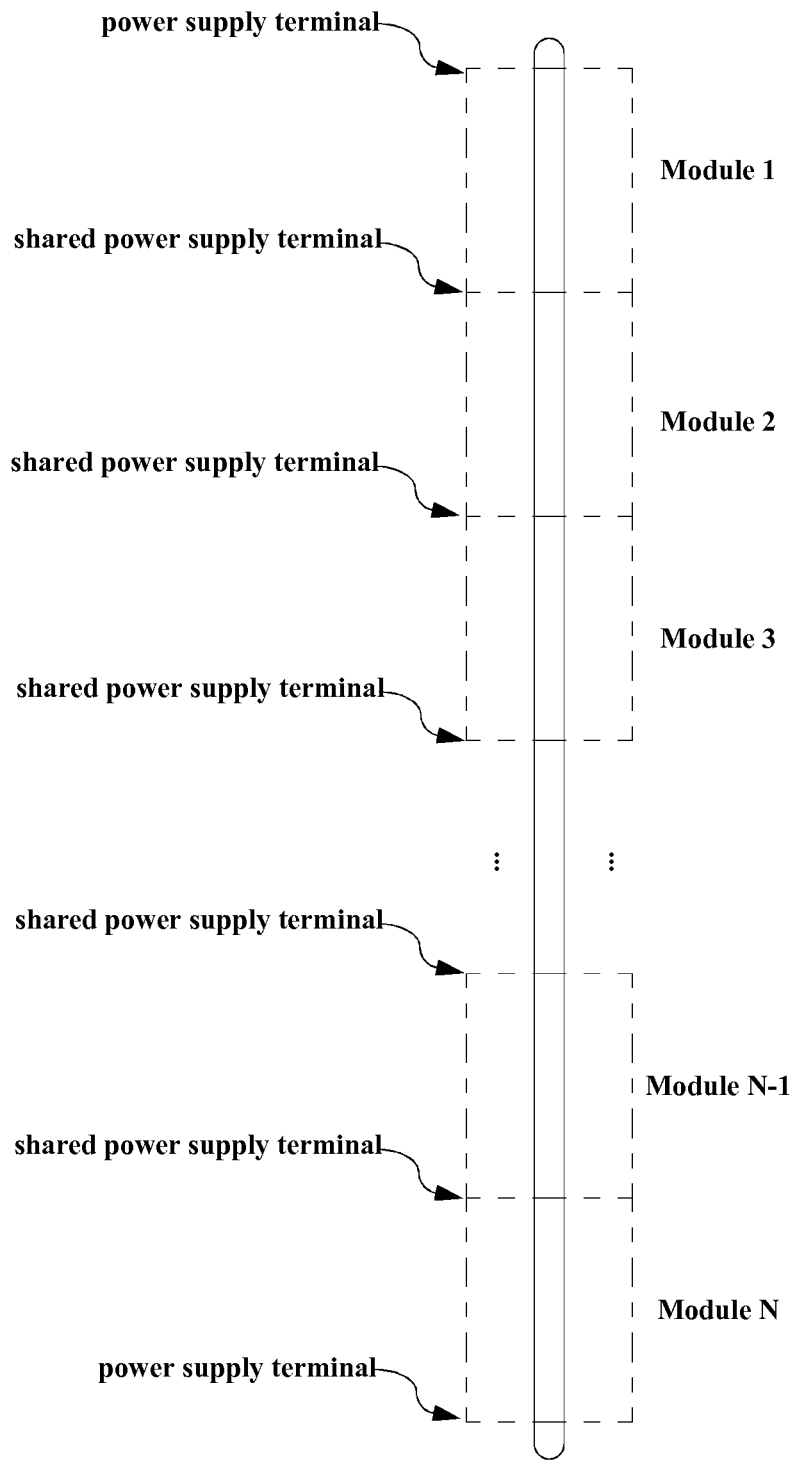
FIG. 6 depicts an exemplary multiple-module implementation wherein both terminating electrodes of each module served as a power supply terminal that can be shared by adjacent modules.

Each of the exemplary arrangements depicted in FIGS. 2a, 2b, 4b, and 5c involves one terminating electrode that serves as a power supply terminal ($V_{DD}$ for FIG. 4b, $V_{SS}$ for FIGS. 2a, 2b, and 5c) and the other terminating electrode that serves as an internal interconnection to the current source subcircuit within the differential amplifier. The latter terminating electrode (serving as an internal interconnection to the current source) in many cases can preclude use of the remaining portion of the nanotube, nanoribbon, strip, or other elongated region of material from use in other circuits. These exemplary adapted differential amplifiers (i.e., those depicted in FIGS. 2a, 2b, 4b, and 5c) would serve more generally, flexibly, and with likely better performance as a modular element in a multiple-module implementation if both terminating electrodes served as a power supply terminal of one type or other. FIG. 6 depicts an exemplary multiple-module implementation wherein both terminating electrodes of each module served as a power supply terminal that can be shared by adjacent modules. In an embodiment, the power supply terminals on either end of each module are for the same power supply polarity (for example, both $V_{SS}$ or both $V_{DD}$). As can be advantageous, additional power supply connections can be made to internal points within a given module. In another embodiment, the power supply terminals on either end of each module are for the same power supply polarity (for example, both $V_{SS}$ or both $V_{DD}$). Here, for each module, one or more opposite power supply connections (for example, $V_{DD}$ or $V_{SS}$, respectively) can be made to internal points within a given module. As can be advantageous, additional power supply connections with the same polarity as the power supply terminals (for example, both $V_{SS}$ or both $V_{DD}$, respectively) can be made to internal points within a given module.

In an inventive step, the invention provides an exemplary arrangement for the differential amplifiers (such as the exemplary ones depicted in FIGS. 2b, 4b, and 5b) wherein both terminating electrodes to serve as a power supply terminal. This is accomplished by incorporating a second current source. To begin, FIG. 7a depicts an instance of Kirchoff's current law for a "Y" topology connection of three conductors. FIG. 7b depicts two concatenated instances of the "Y" topology of FIG. 7a. In a variation of FIG. 7b, FIG. 7c depicts a construction wherein the vertical bridge is collapsed into an "H" topology connection of four conductors arranged in two pairs linked by a horizontal bridge.

Figure 8A:
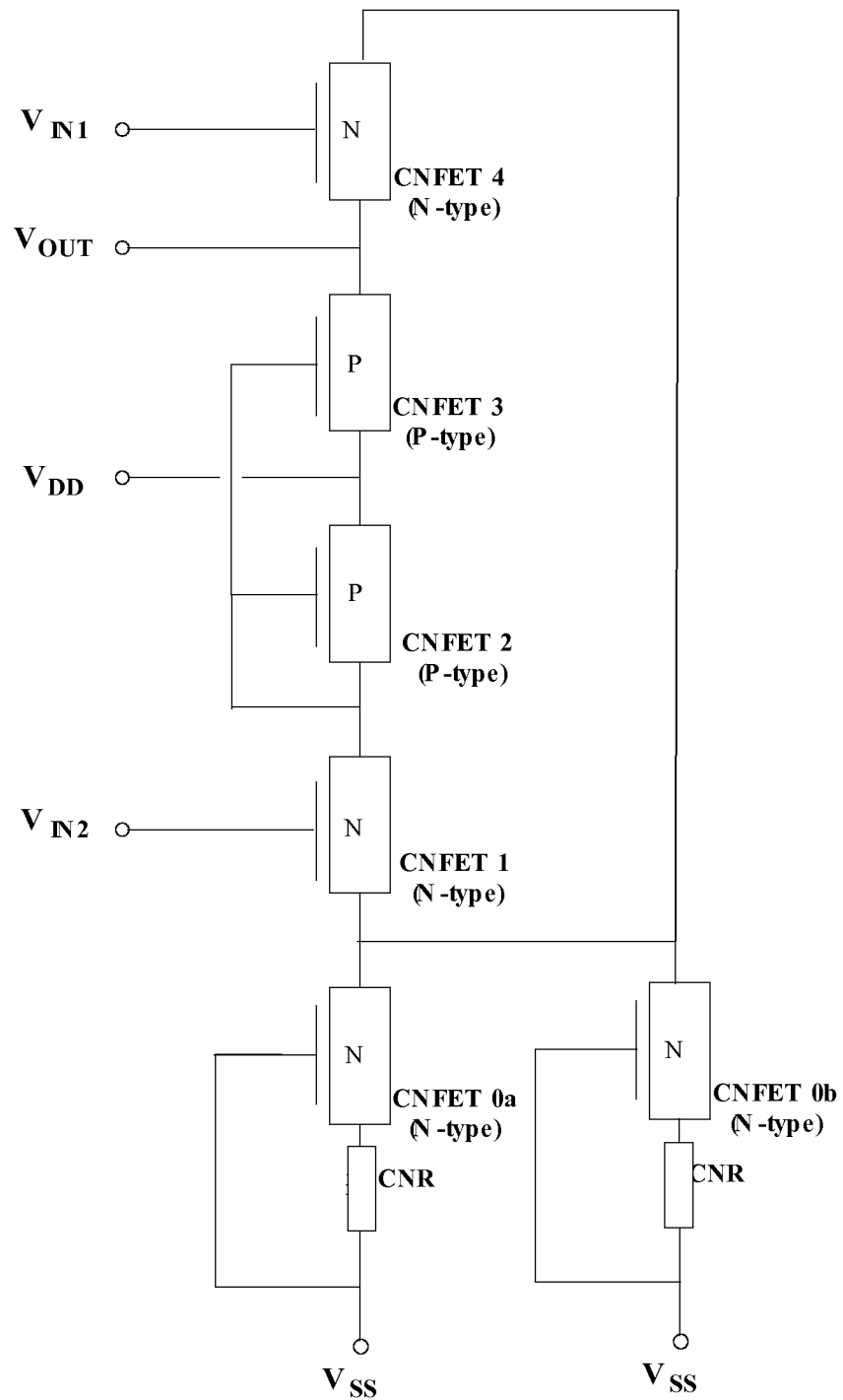
FIG. 8a depicts an exemplary CNFET (or other insulated gate field-effect transistor implemented on a portion of an elongated semiconductor) differential amplifier adaptation comprising two adjacently located current sources rather than a single current source.
Figure 8B:
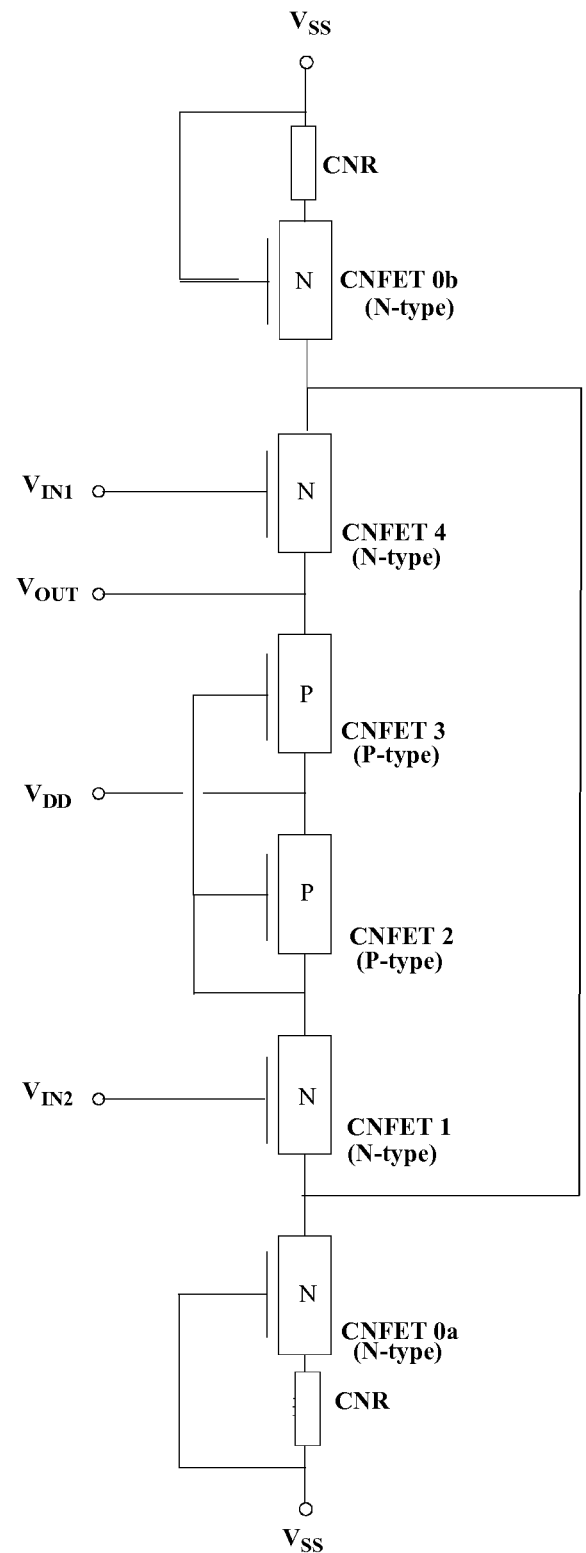
FIG. 8b depicts an adaptation of the circuit of FIG. 8a wherein one of the two current sources has been geometrically moved, maintaining the same circuit topology, to the opposite extreme of the differential amplifier chain, resulting in a differential amplifier module terminating on each end with a power supply terminal.
Figure 9:
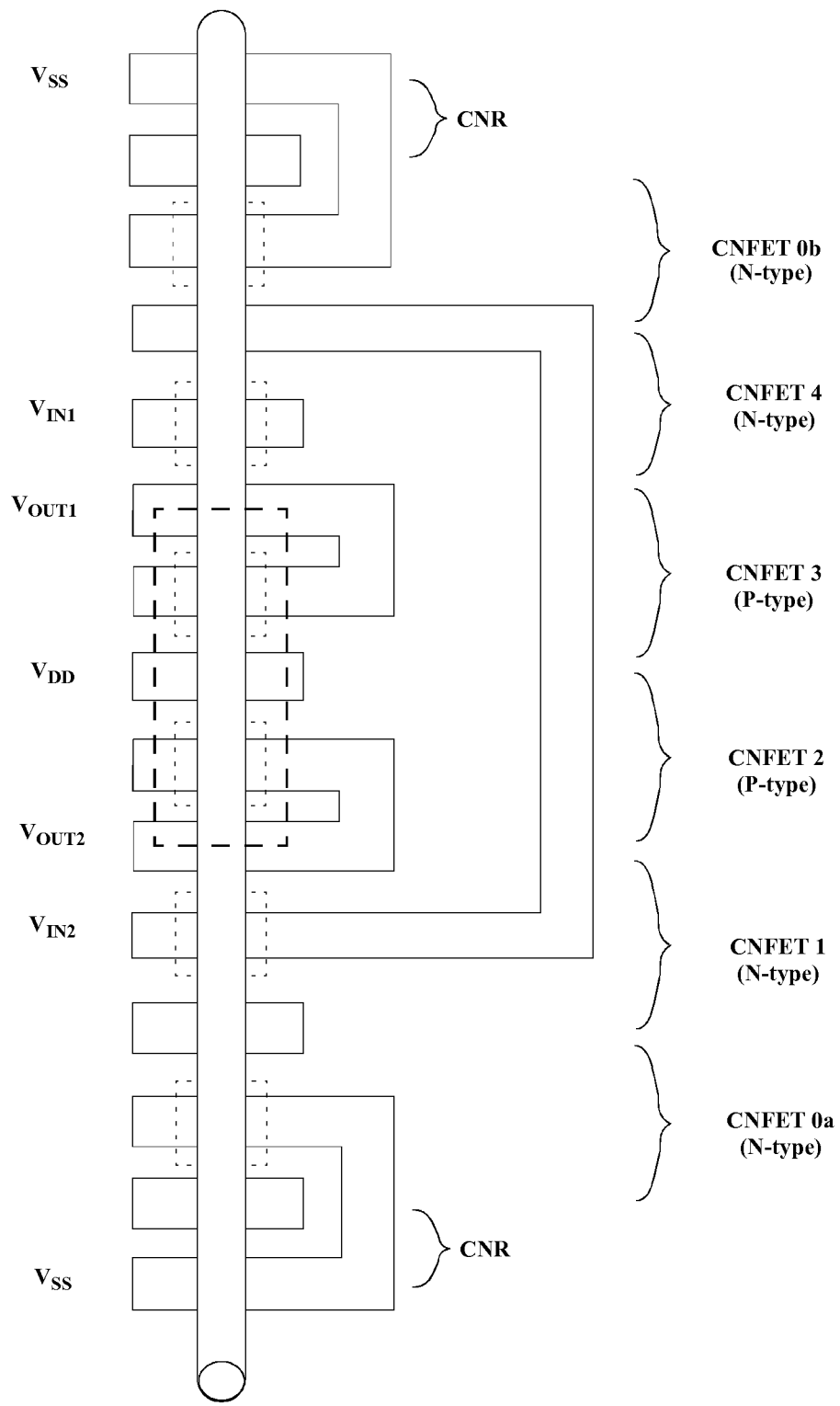
FIG. 9 depicts a carbon nanotube (or other elongated semiconductor structure) implementation of the differential amplifier adaptation of FIG. 8b, resulting in a differential amplifier module on a section of a single carbon nanotube (or other elongated semiconducting structure) terminating on each end with a power supply terminal.

FIG. 8a depicts an exemplary CNFET (or other insulated gate field-effect transistors implemented on a portion of an elongated semiconductor) differential amplifier adaptation of the circuit of FIG. 1d comprising two adjacently located current sources rather than a single current source. The electrical result is that the differential ladder portion of the differential amplifier is supplied with twice the current as is the case in the circuit of FIG. 1d. The current sources can be adjusted and/or replaced with other types of current sources to compensate or advantageously use the added current supplying capacity. However, the purpose for adding the second current source can be seen immediately in FIG. 8b. FIG. 8b depicts an adaptation of the circuit of FIG. 8a wherein one of the two current sources has been geometrically moved, maintaining the same circuit topology, to the opposite extreme of the differential amplifier chain, resulting in a differential amplifier module terminating on each end with a power supply terminal. FIG. 9 depicts a carbon nanotube (or other elongated semiconductor structure) implementation of the differential amplifier adaptation of FIG. 8b, resulting in a differential amplifier module on a section of a single carbon nanotube (or other elongated semiconductor structure) terminating on each end with a power supply terminal.

Figure 10:
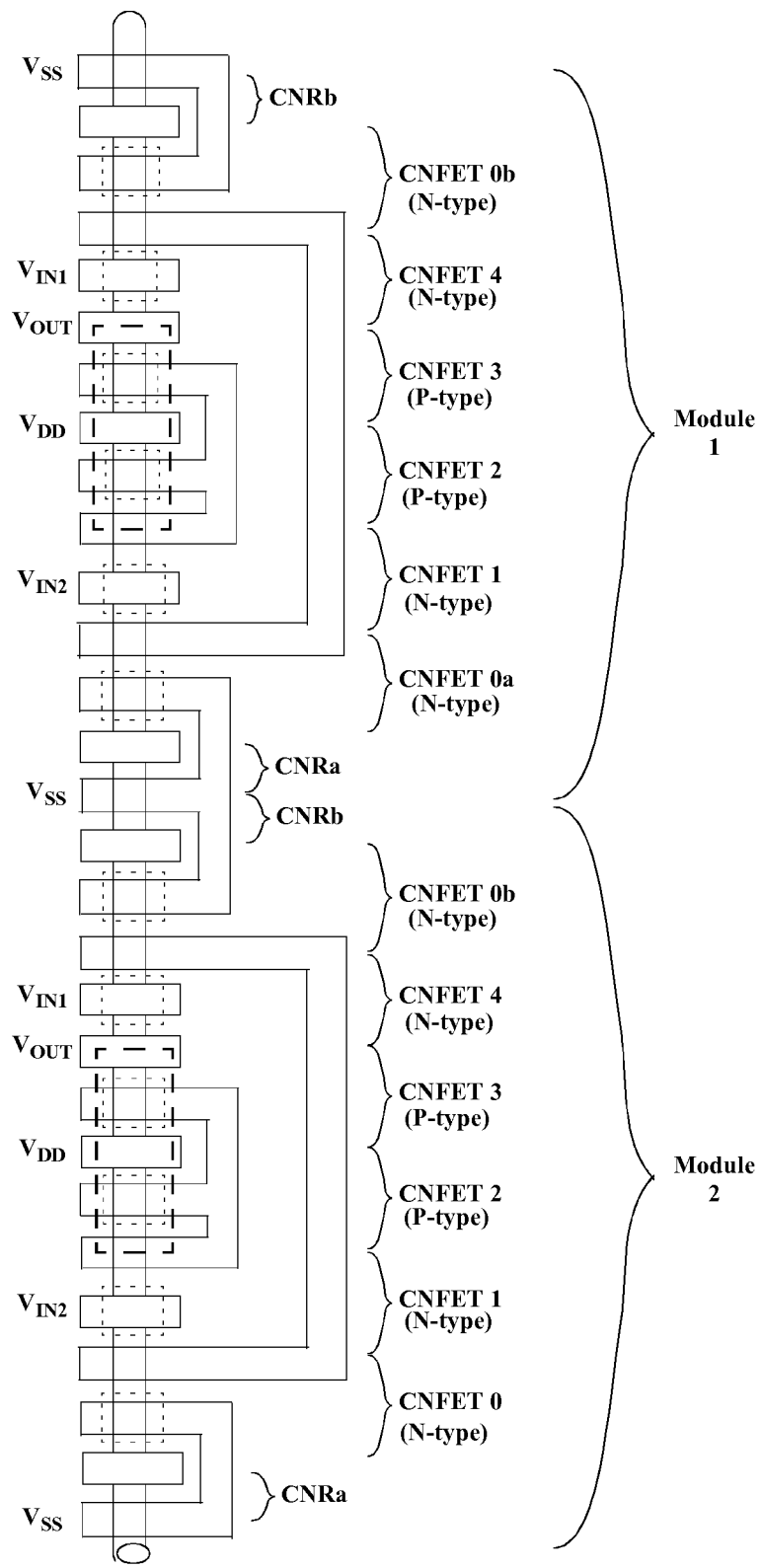
FIG. 10 depicts an exemplary arrangement comprising two exemplary CNFET differential amplifier modules, the modules such as that depicted in FIG. 9, each pairwise-adjacently arranged on the same carbon nanotube (or other elongated semiconductor structure).
Figure 11:
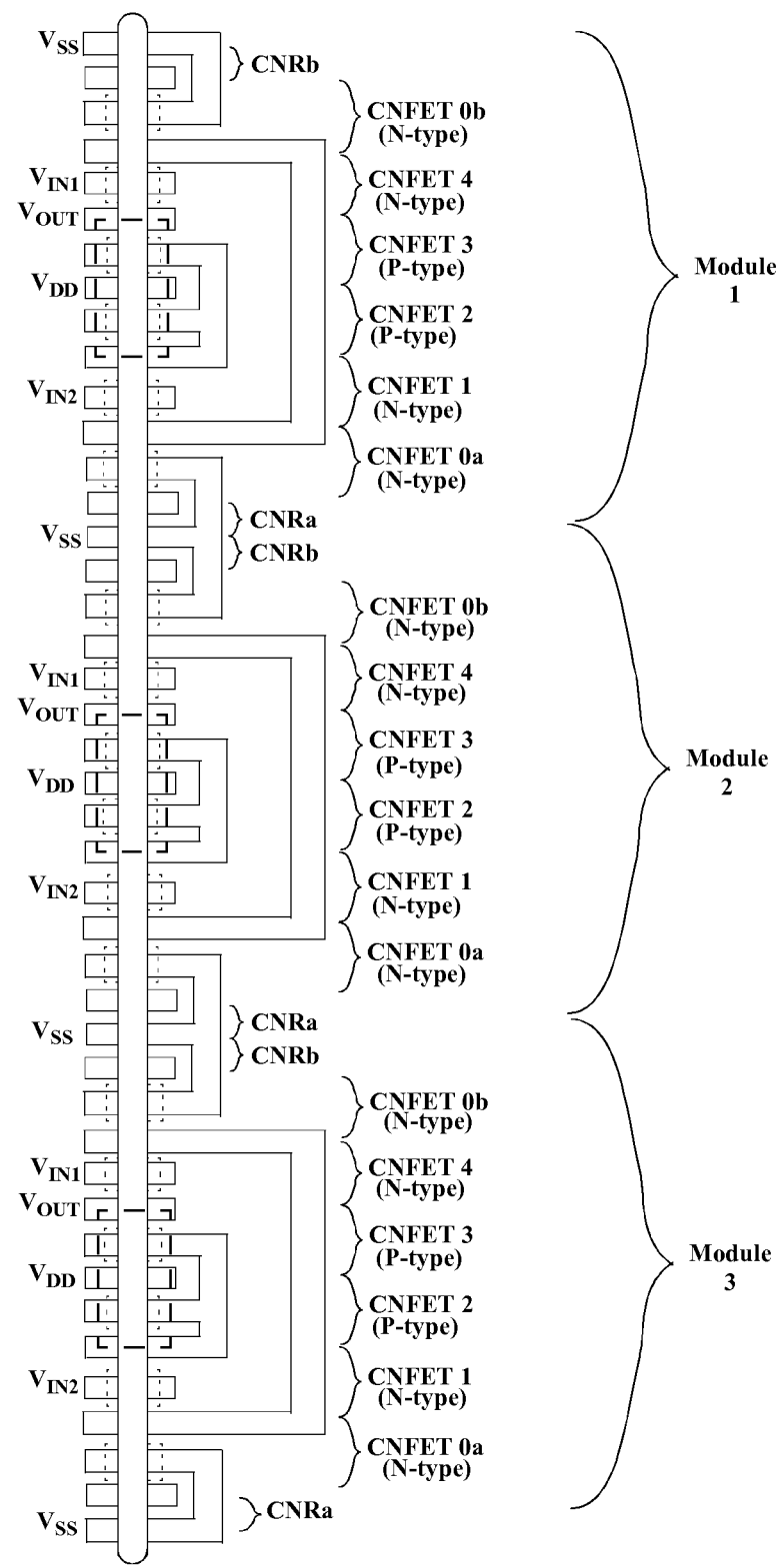
FIG. 11 depicts an exemplary arrangement comprising three exemplary CNFET differential amplifier modules pairwise-adjacently arranged on the same carbon nanotube or other elongated semiconducting material.
Figure 12:
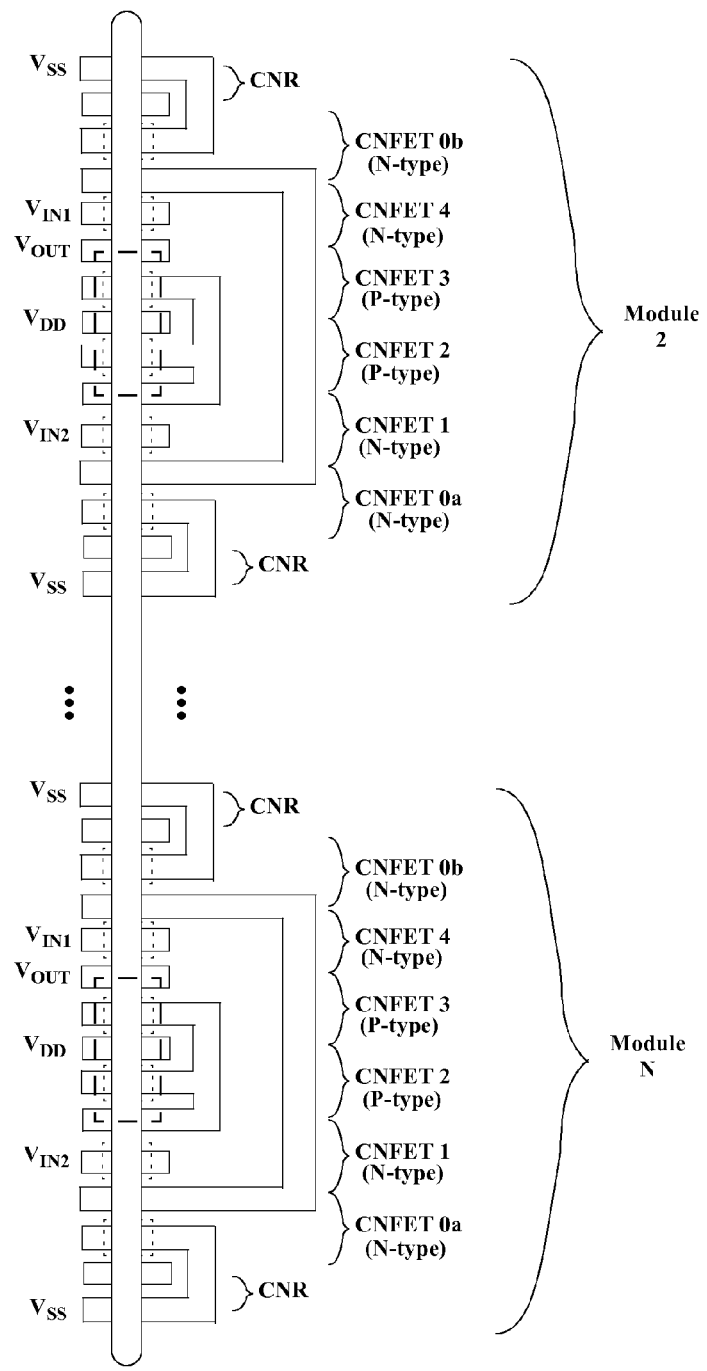
FIG. 12 depicts an exemplary arrangement comprising an arbitrary plurality of exemplary CNFET differential amplifier modules pairwise-adjacently arranged on the same carbon nanotube or other elongated semiconducting structure.

As a first simple exemplary illustration of the power of this approach, consider simply implementing the arrangement depicted in FIG. 6 for the case of N=2 with two instances of modules such as that depicted in FIG. 9. FIG. 10 depicts an exemplary arrangement comprising two exemplary CNFET (or other insulated gate field-effect transistors implemented on a portion of an elongated semiconductor) differential amplifier modules, the modules such as that depicted in FIG. 9, each pairwise-adjacently arranged on the same carbon nanotube (or other elongated semiconductor structure). Similarly, for the case of N=3, FIG. 11 depicts an exemplary arrangement comprising three exemplary CNFET (or other insulated gate field-effect transistors implemented on a portion of an elongated semiconductor) differential amplifier modules, each such as that depicted in FIG. 9, pairwise-adjacently arranged on the same carbon nanotube (or other elongated semiconductor structure). FIG. 12 depicts a more general exemplary arrangement comprising an arbitrary plurality of exemplary CNFET differential amplifier modules pairwise-adjacently arranged on the same carbon nanotube (or other elongated semiconductor structure).

The various power supply terminals and internal power supply points can be interconnected with power supply buses—at least one for $V_{SS}$ and at least one for $V_{DD}$—serving a plurality of the modules. In an embodiment at least one of the busses can be buried under and insulating layer.

Figure 13A:
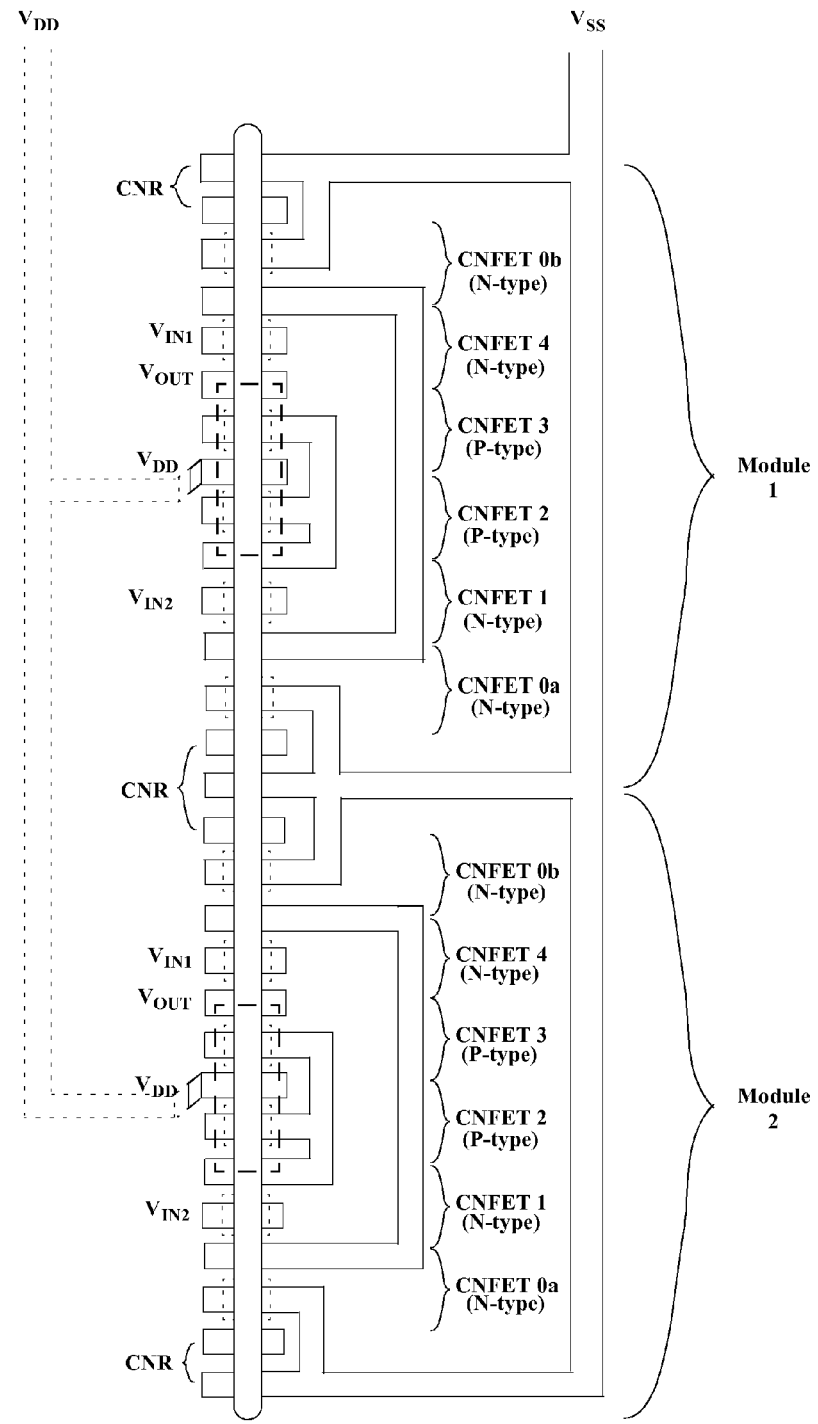
FIG. 13a depicts an exemplary arrangement of two exemplary CNFET differential amplifier modules pairwise-adjacently arranged on the same carbon nanotube (or other elongated semiconducting structure) where all the $V_{DD}$ power supply terminals are connected by an insulated power supply conductor positioned on the opposite side of the nanotube (or other elongated semiconducting structure) as the $V_{SS}$ power supply conductor.

FIG. 13a depicts an exemplary arrangement of two exemplary CNFET differential amplifier modules pairwise-adjacently arranged on the same carbon nanotube (or other elongated semiconductor structure) where all the $V_{DD}$ power supply terminals are connected by an insulated power supply conductor positioned on the opposite side of the nanotube (or other elongated semiconductor structure) as the $V_{SS}$ power supply conductor.

Figure 13B:
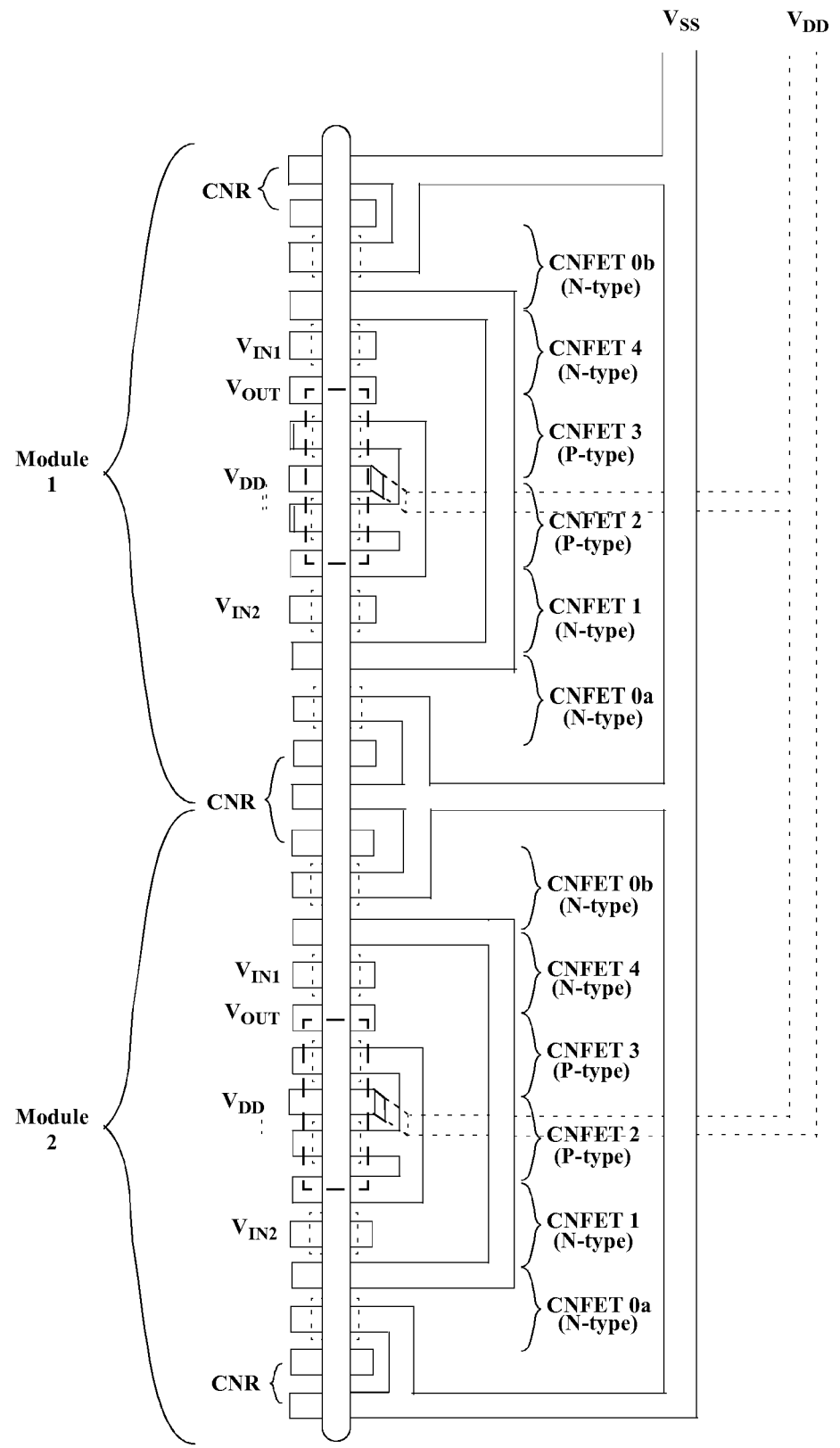
FIG. 13b depicts a variation of FIG. 13a wherein the insulated power supply conductor is on the same side of the nanotube (or other elongated semiconducting structure) as the $V_{SS}$ power supply conductor.

FIG. 13b depicts a variation of FIG. 13a wherein the insulated power supply conductor is on the same side of the nanotube (or other elongated semiconductor structure) as the $V_{SS}$ power supply conductor. Such an arrangement leaves one full side of the nanotube (or other elongated semiconductor structure) free for, for example, signal interconnections.

Figure 14:
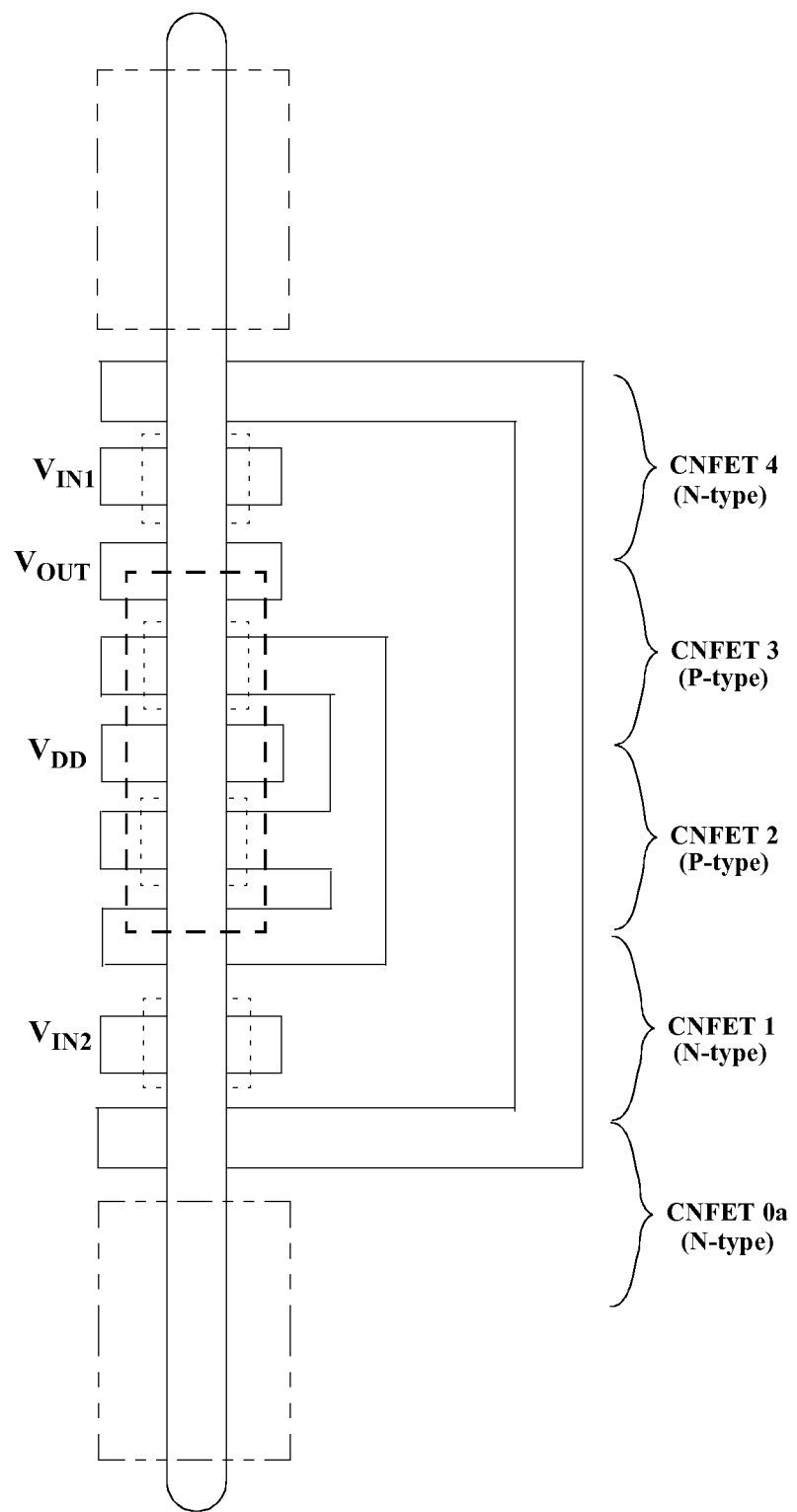
FIG. 14 depicts an exemplary arrangement wherein an exemplary differential amplifier ladder module that is configured to be driven by two current sources is specifically arranged so as to interconnect with a pair of arbitrary types of current sources, one on either side of the exemplary differential (amplifier) ladder module.

Thus far, only a single simple exemplary type of current source has been used. However, the invention provides for use of a wide variety of types of current sources, and for these to be implemented, for example, in one or more localized section(s) of a carbon nanotube, graphene nanoribbons, semiconducting polymers or organic semiconductors, or other related materials at various physical implementation scales. Accordingly, FIG. 14 depicts an exemplary arrangement wherein an exemplary differential amplifier ladder module (here, the one employed in FIG. 2b and FIG. 9) that is configured to be driven by two current sources (as in FIG. 9) is specifically arranged so as to interconnect with a pair of arbitrary types of current sources, one on either side of the exemplary differential amplifier ladder module. It is understood that similar arrangements can be made for the exemplary differential amplifier depicted in FIGS. 4b and 5b).

Providing a selection of different types of current sources allows for variation in current values, performance, transient behavior, power supply immunity, minimum voltage drop across the current source, etc.

Additionally, providing for a selection of different types of current sources which in turn can be used in a selection of different types of differential amplifiers demonstrates another aspect of the invention, namely hierarchical modularity. In an embodiment, the invention therefore provides for modules to be used as components within other modules. As the differential amplifiers can be used as components within larger circuits or systems, which in turn can be structured as modules, these larger circuits or systems in turn can be structured as modules which can be used as components within yet larger circuits or systems, etc., the invention provides for hierarchical modularity comprising an arbitrary number of levels and/or an arbitrary number of depths.

Figure 15A:
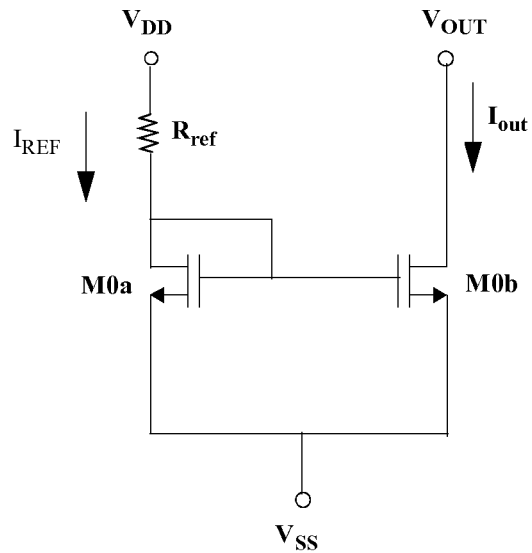
FIG. 15a depicts an exemplary simple current source employ a current mirror driven by a simple resistive current source.
Figure 15B:
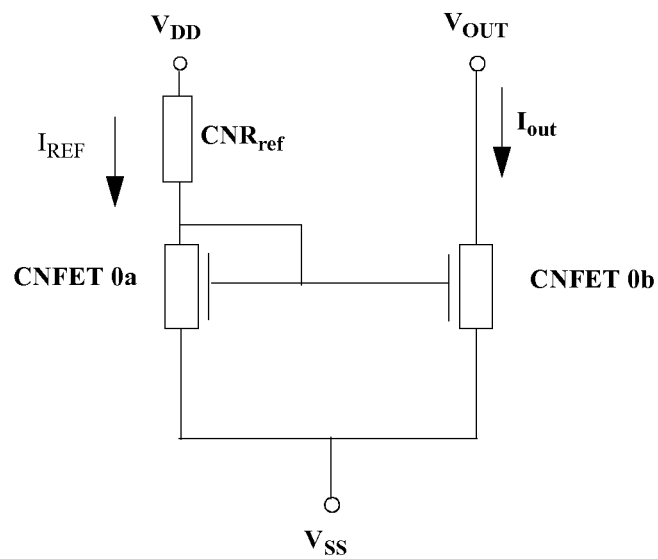
FIG. 15b depicts an adaptation of FIG. 15a wherein CNFETs (or other insulated gate field-effect transistors implemented on a portion of an elongated semiconductor) of appropriate complementary types (N-type and P-type) replace the corresponding insulated gate field-effect transistors (such MOSFETs).
Figure 15C:
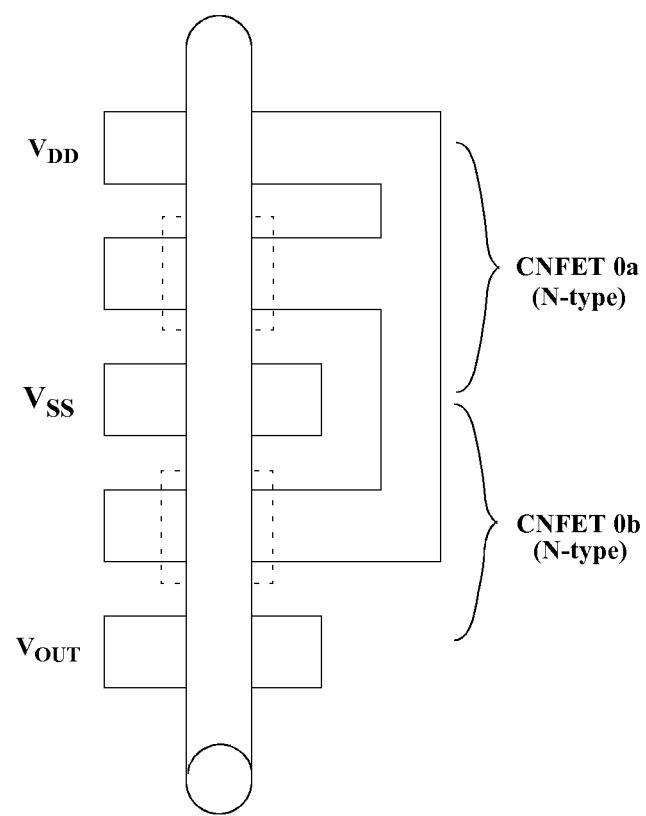
FIG. 15c depicts an exemplary implementation of the current source circuit of FIG. 15b, arranged as a segment on the same carbon nanotube or other elongated semiconducting material.

As a first example of an alternate current source as provided for by the invention, FIG. 15a depicts an exemplary simple current source employ a current mirror driven by a simple resistive current source, Accordingly, FIG. 15b depicts an adaptation of FIG. 15a wherein CNFETs (or other insulated gate field-effect transistor implemented on a portion of a elongated semiconductor) of appropriate complementary types (N-type and P-type) replace the corresponding insulated gate field-effect transistors (such as MOSFETs). FIG. 15c depicts an exemplary carbon nanotube (or other elongated semiconductor structure) implementation of the current source circuit of FIG. 15b, arranged as a segment on the same carbon nanotube (or other elongated semiconductor structure).

Figure 16A:
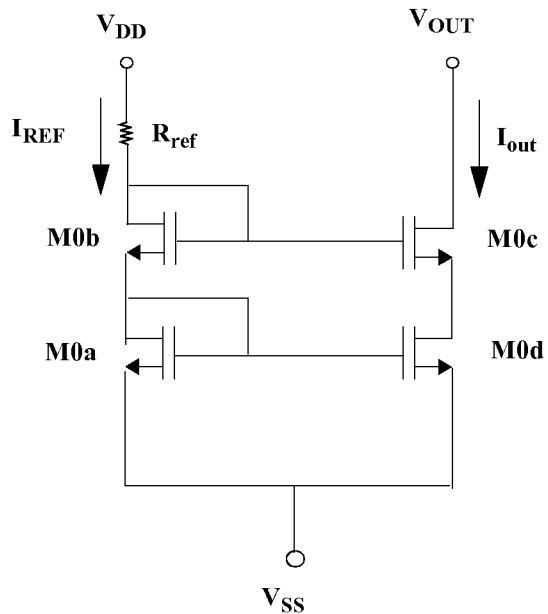
FIG. 16a depicts an exemplary cascode current source.
Figure 16B:
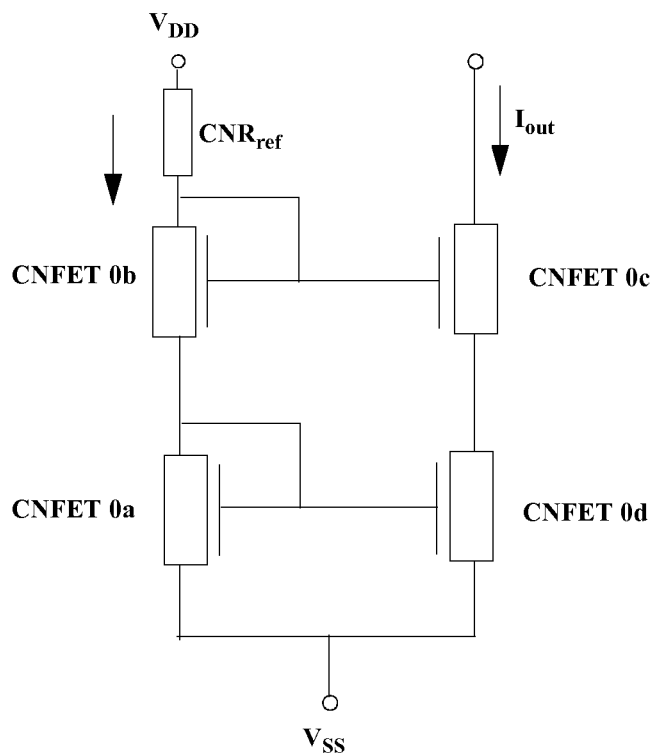
FIG. 16b depicts an adaptation of FIG. 16a wherein CNFETs (or other insulated gate field-effect transistors implemented on a portion of an elongated semiconductor) of appropriate complementary types (N-type and P-type) replace the corresponding insulated gate field-effect transistors (such as MOSFETs).
Figure 16C:
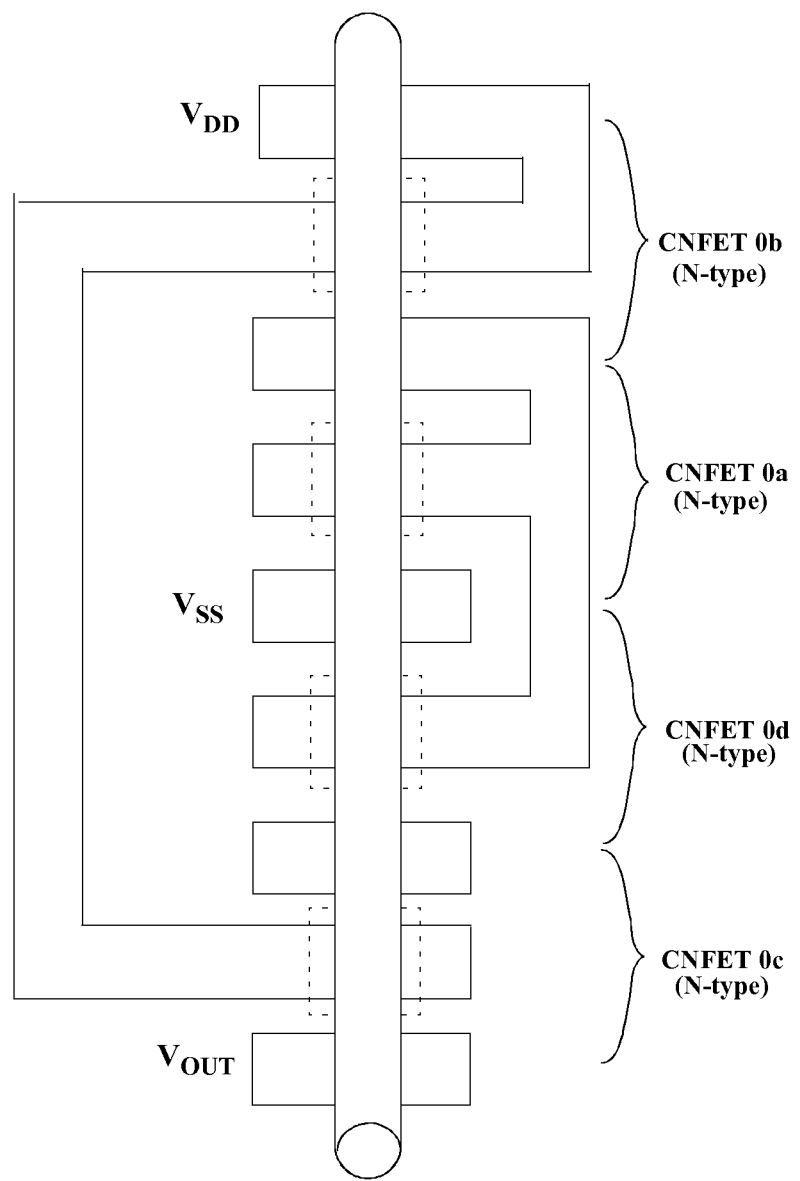
FIG. 16c depicts an exemplary implementation of the current source circuit of FIG. 16b, arranged as a segment on the same carbon nanotube or other elongated semiconducting material.

As a second example of an alternate current source as provided for by the invention, FIG. 16a depicts an exemplary cascode current source. Accordingly, FIG. 16b depicts an adaptation of FIG. 16a wherein CNFETs (or other insulated gate field-effect transistor implemented on a portion of a elongated semiconductor) of appropriate complementary types (N-type and P-type) replace the corresponding insulated gate field-effect transistors (such as MOSFETs). FIG. 16c depicts an exemplary carbon nanotube (or other elongated semiconductor structure) implementation of the current source circuit of FIG. 16b, arranged as a segment on the same carbon nanotube.

Figure 17A:
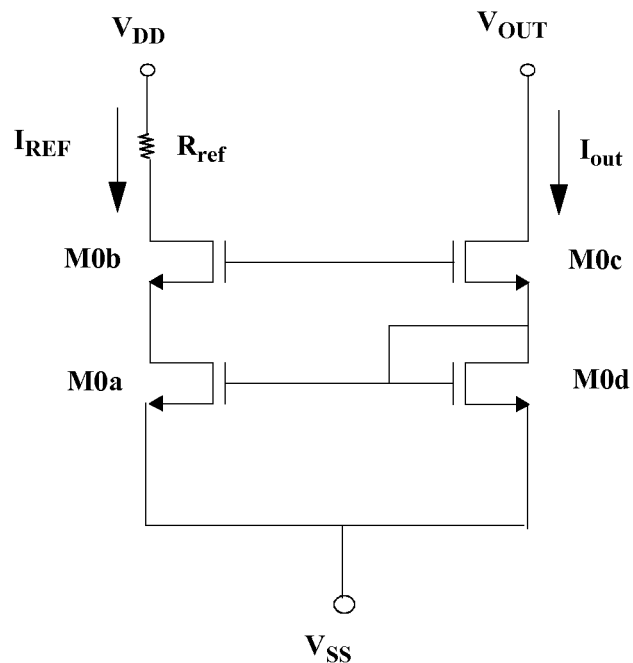
FIG. 17a depicts an exemplary Wilson Source.
Figure 17B:
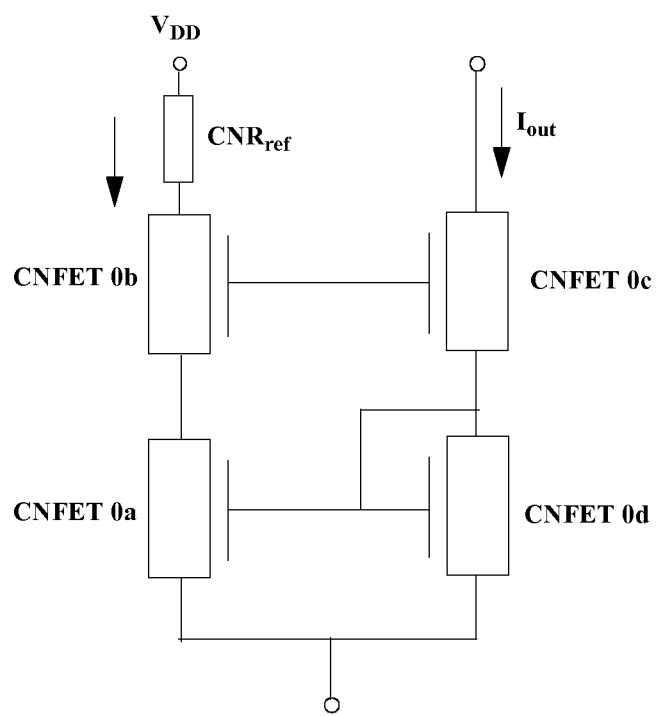
FIG. 17b depicts an adaptation of FIG. 17a wherein CNFETs (or other insulated gate field-effect transistors implemented on a portion of an elongated semiconductor) of appropriate complementary types (N-type and P-type) replace the corresponding insulated gate field-effect transistors (such as MOSFETs).
Figure 17C:
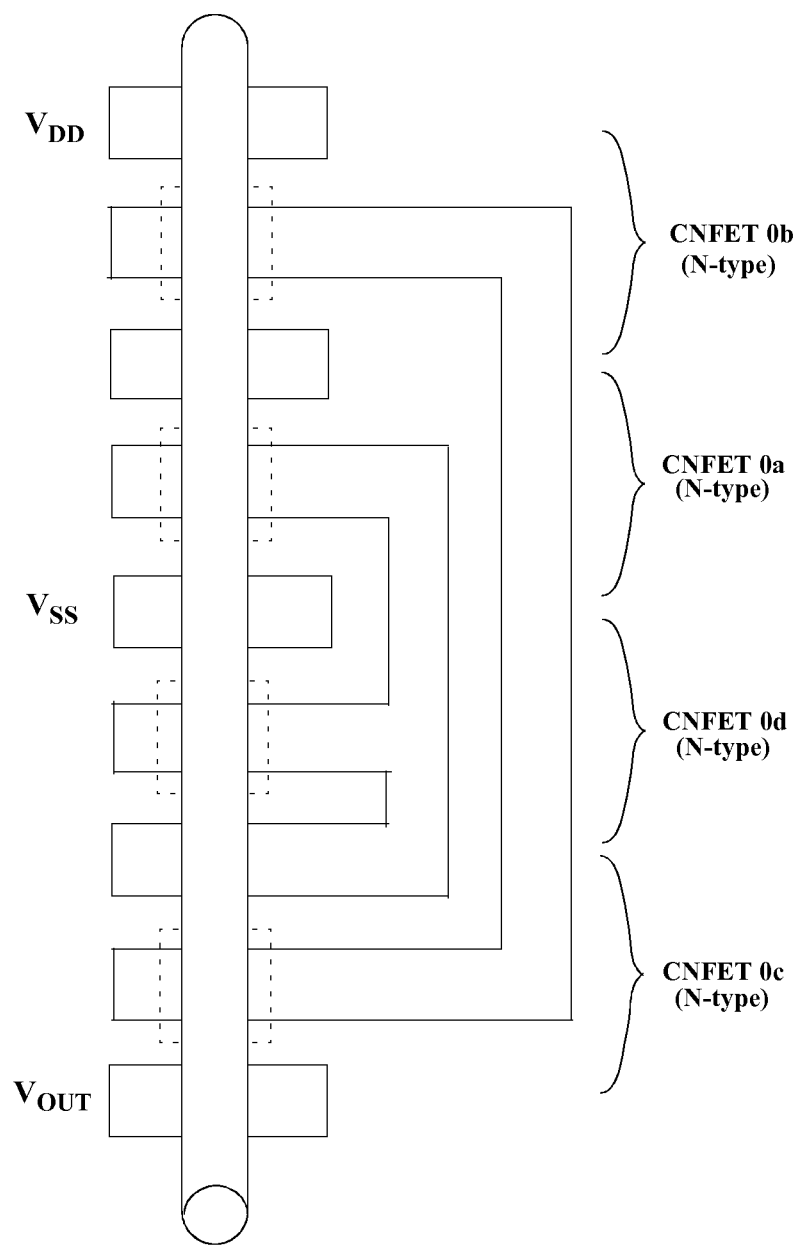
FIG. 17c depicts an exemplary implementation of the current source circuit of FIG. 17b, arranged as a segment on the same carbon nanotube or other elongated semiconducting material.

As a third example of an alternate current source as provided for by the invention, FIG. 17a depicts an exemplary Wilson current source. Accordingly, FIG. 17b depicts an adaptation of FIG. 17a wherein CNFETs (or other insulated gate field-effect transistors implemented on a portion of an elongated semiconductor) of appropriate complementary types (N-type and P-type) replace the corresponding insulated gate field-effect transistors (such as MOSFETs). FIG. 17c depicts an exemplary carbon nanotube (or other elongated semiconductor structure) implementation of the current source circuit of FIG. 17b, arranged as a segment on the same carbon nanotube (or other elongated semiconductor structure).

Figure 18A:
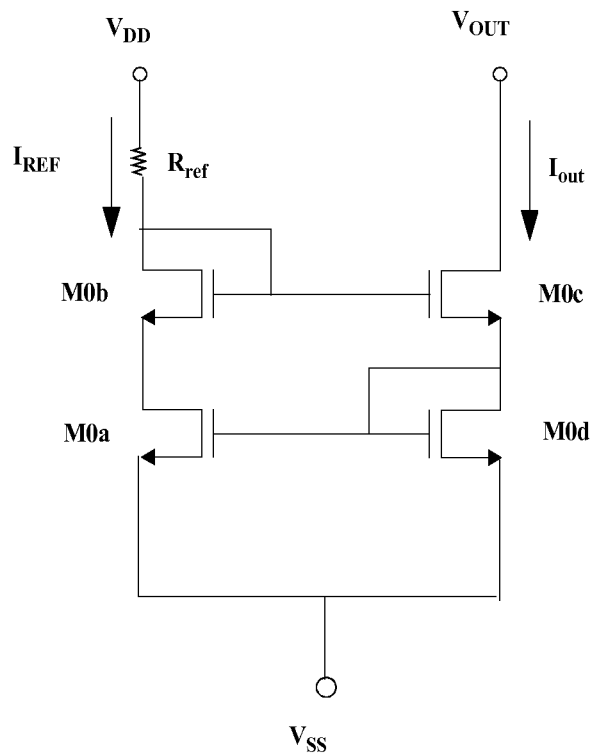
FIG. 18a depicts an exemplary improved Wilson Source.
Figure 18B:
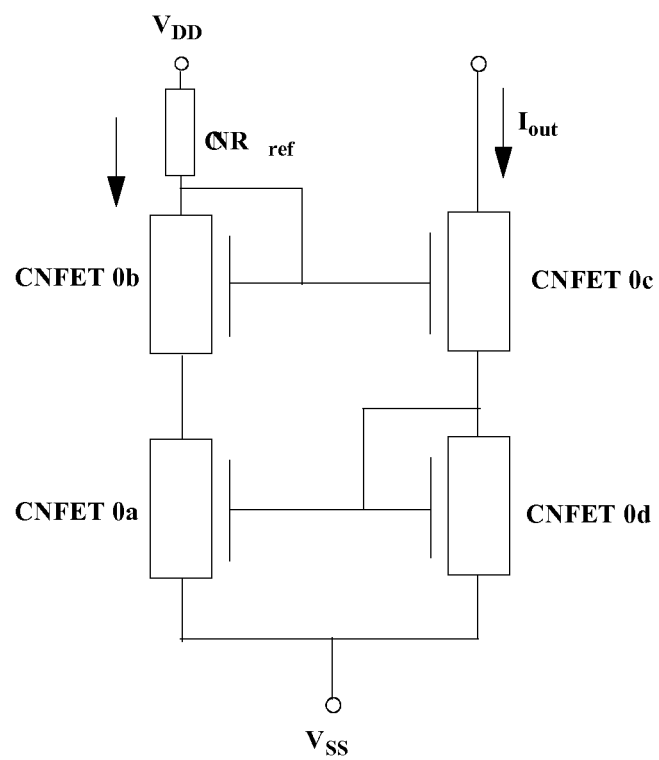
FIG. 18b depicts an adaptation of FIG. 18a wherein CNFETs (or other insulated gate field-effect transistors implemented on a portion of an elongated semiconductor) of appropriate complementary types (N-type and P-type) replace the corresponding insulated gate field-effect transistors (such as MOSFETs).
Figure 18C:
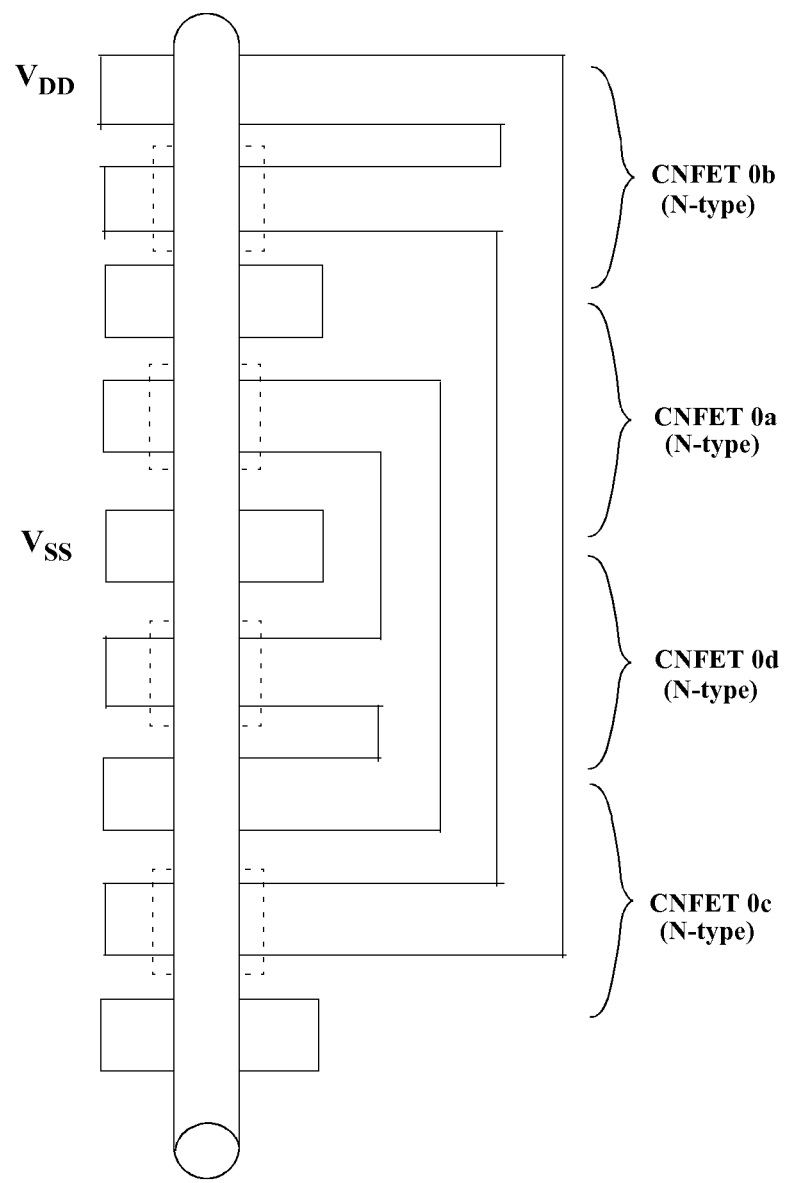
FIG. 18c depicts an exemplary implementation of the current source circuit of FIG. 18b, arranged as a segment on the same carbon nanotube or other elongated semiconducting material.

As a fourth example of an alternate current source as provided for by the invention, FIG. 18a depicts an exemplary improved Wilson current source. Accordingly, FIG. 18b depicts an adaptation of FIG. 18a wherein CNFETs (or other insulated gate field-effect transistor implemented on a portion of an elongated semiconductor) of appropriate complementary types (N-type and P-type) replace the corresponding insulated gate field-effect transistors (such as MOSFETs). FIG. 18c depicts an exemplary implementation of the current source circuit of FIG. 18b, arranged as a segment on the same carbon nanotube (or other elongated semiconductor structure).

Figure 19A:
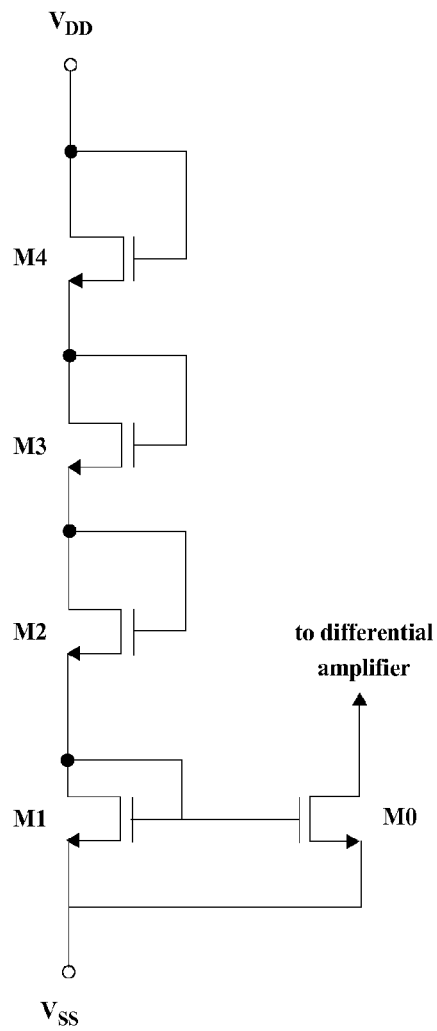
FIG. 19a depicts an exemplary FET-ladder/current-mirror current source.
Figure 19B:
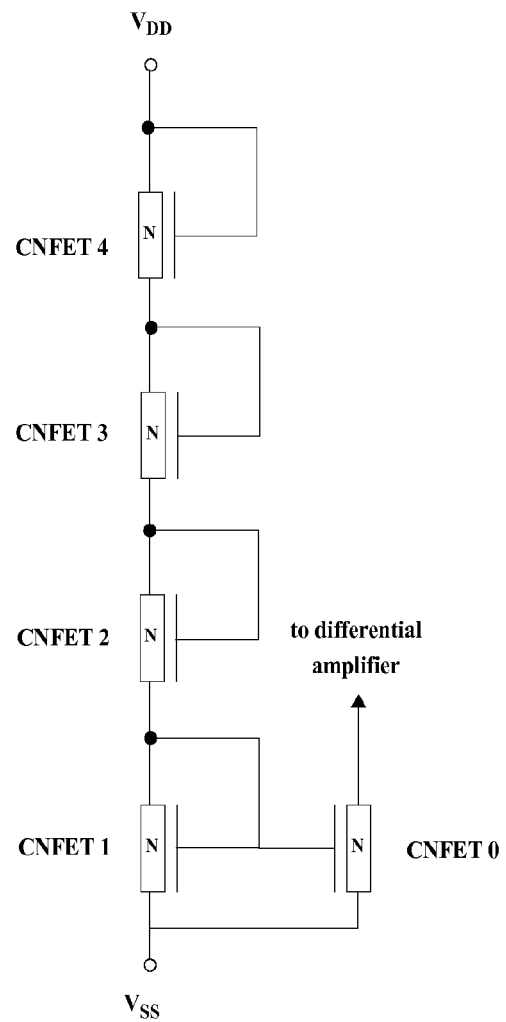
FIG. 19b depicts an adaptation of FIG. 19a wherein CNFETs (or other insulated gate field-effect transistors implemented on a portion of an elongated semiconductor) of appropriate complementary types (N-type and P-type) replace the corresponding insulated gate field-effect transistors (such as MOSFETs).
Figure 19C:
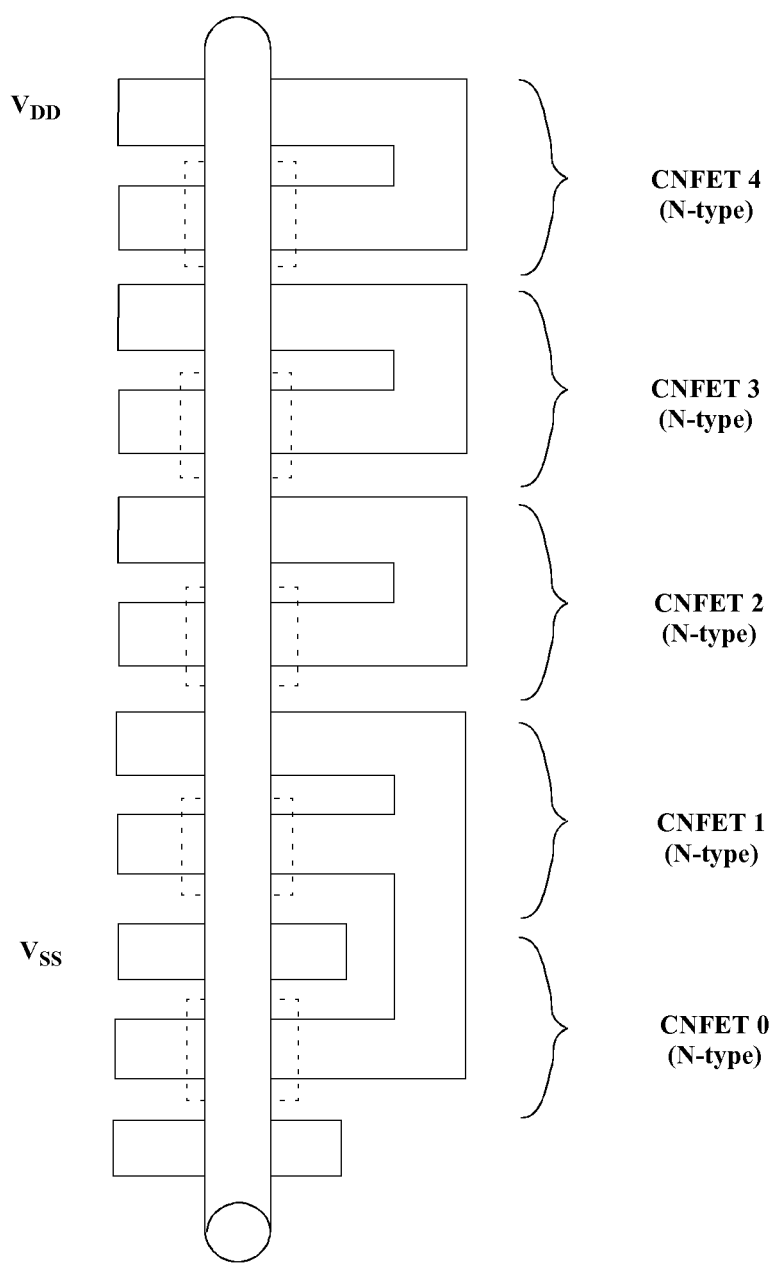
FIG. 19c depicts an implementation of the current source circuit of FIG. 19b, arranged as a segment on the same carbon nanotube or other elongated semiconducting material.

As a fifth example of an alternate current source as provided for by the invention, FIG. 19a depicts an exemplary FET-ladder/current-mirror current source. Here the number of FETs in the latter can be used to set the current provided by the current mirror output of the current source. Accordingly, FIG. 19b depicts an adaptation of FIG. 19a wherein CNFETs (or other insulated gate field-effect transistors implemented on a portion of an elongated semiconductor) of appropriate complementary types (N-type and P-type) replace the corresponding insulated gate field-effect transistors (such as MOSFETs). FIG. 19c depicts an implementation of the current source circuit of FIG. 19b, arranged as a segment on the same carbon nanotube (or other elongated semiconductor structure).

Figure 20A:
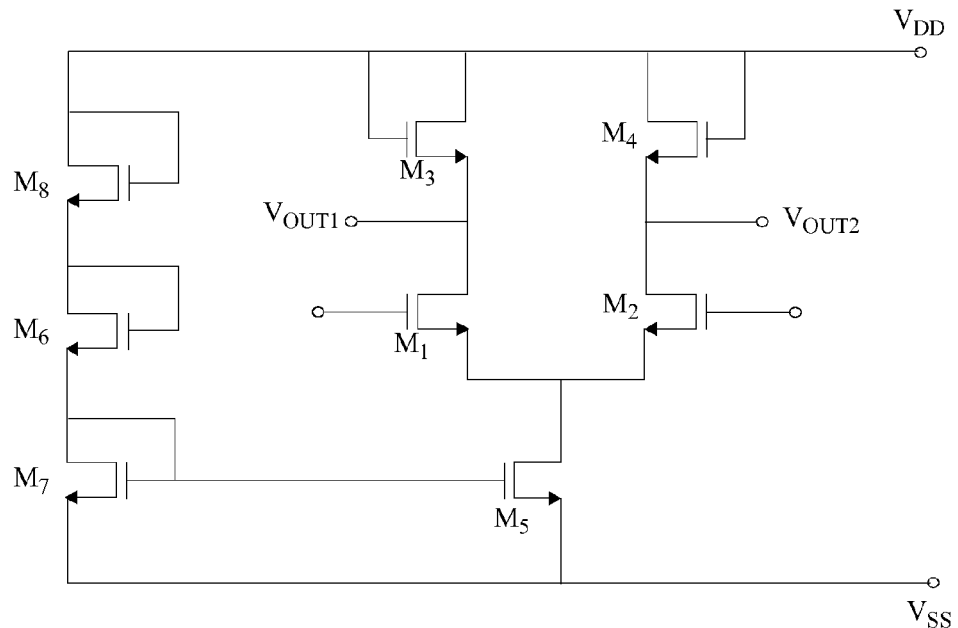
FIG. 20a depicts an exemplary voltage-independent current source.
Figure 20B:
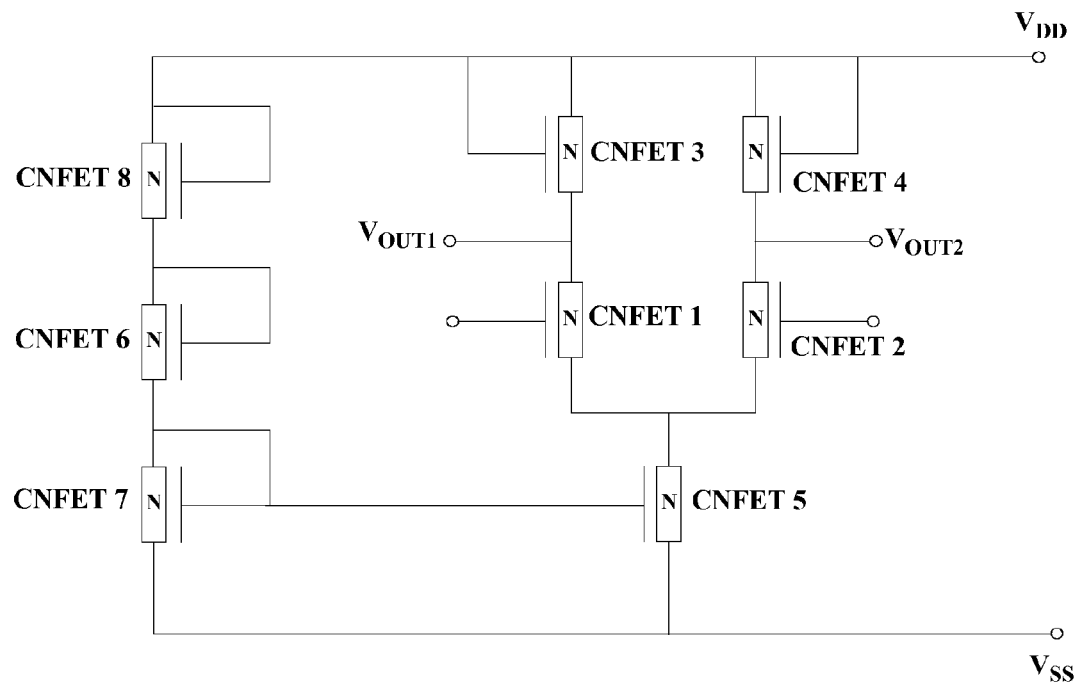
FIG. 20b depicts adaptation of to FIG. 20a wherein CNFETs (or other insulated gate field-effect transistors implemented on a portion of an elongated semiconductor) of appropriate complementary types (N-type and P-type) replace the corresponding insulated gate field-effect transistors (such as MOSFETs).
Figure 20C:
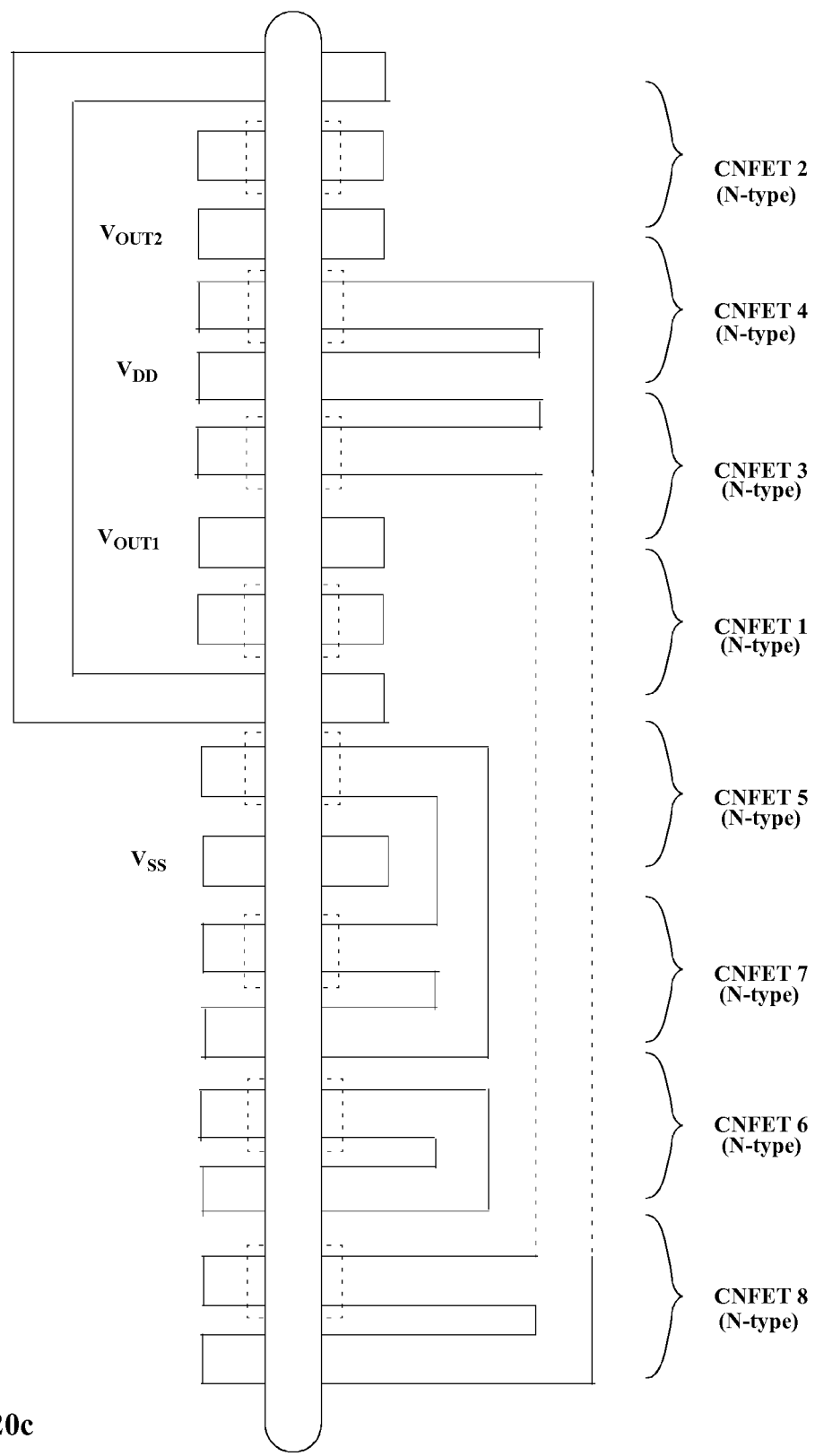
FIG. 20c depicts an exemplary implementation of the current source circuit of FIG. 20b, arranged as a segment on the same carbon nanotube or other elongated semiconducting material.

In many situations it can be advantageous for the current source to offer an output largely unaffected by a range of variation in power supply voltages. As a sixth example of an alternate current source as provided for by the invention, FIG. 20a depicts an exemplary voltage-independent current source. Accordingly, FIG. 20b depicts adaptation of to FIG. 20a wherein CNFETs (or other insulated gate field-effect transistors implemented on a portion of an elongated semiconductor) of appropriate complementary types (N-type and P-type) replace the corresponding insulated gate field-effect transistors (such as MOSFETs). FIG. 20c depicts an exemplary implementation of the current source circuit of FIG. 20b, arranged as a segment on the same carbon nanotube (or other elongated semiconductor structure).

Finally, further to the notion of the aforementioned notions of hierarchical modularity and also to the operational amplifier concepts presented in U.S. Pat. No. 7,838,809, FIGS. 21a-21c, 22a-22b, and 23a-23c depict various multiple-stage differential amplifier configurations comprised of:
    one or more single output differential amplifier module(s) as depicted in FIG. 9
or
    one or more differential output differential amplifier module(s) as depicted in FIG. 4b but modified to include two current sources as in FIG. 9.

Internal to each of the differential amplifier modules, various current source modules, such as the six exemplary ones described earlier, can be employed, homogenously or heterogeneously as can prove advantageous.

Figure 21A:
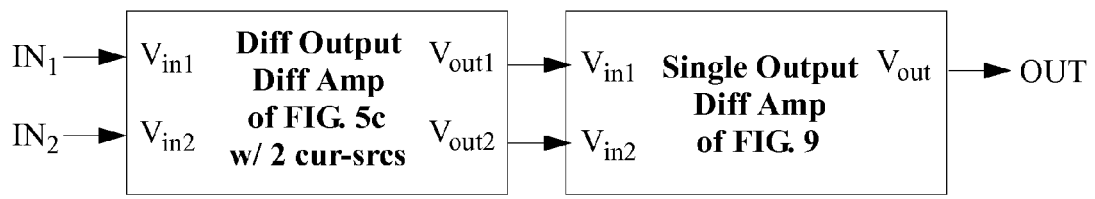
FIGS. 21a-21c, 22a-22b, and 23a-23c depict various multiple-stage differential amplifier configurations comprised of one or more single output differential amplifier module(s) and/or one or more differential output differential amplifier module(s) as depicted in FIG. 4b but modified to include two current sources as in FIG. 9.

FIG. 21a depicts an exemplary two-stage differential amplifier comprising a differential output differential amplifier followed by a single output differential amplifier.

Figure 21B:
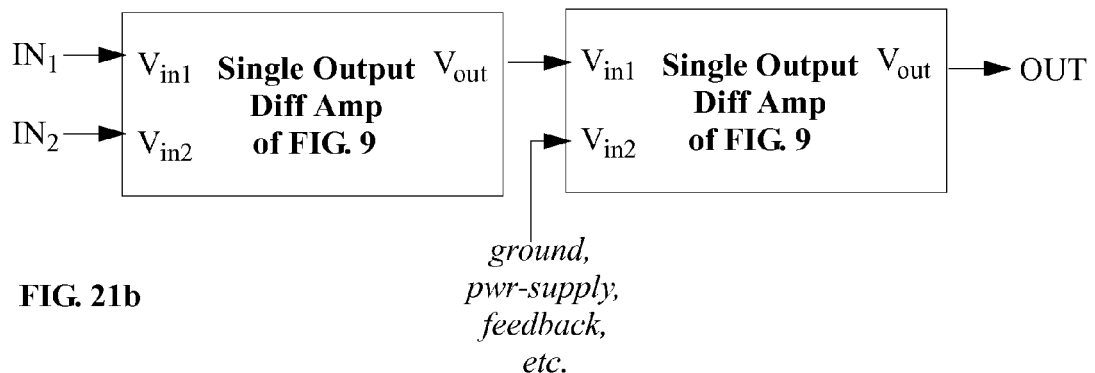

FIG. 21b depicts an exemplary two-stage differential amplifier comprising a first single output differential amplifier followed by a second single output differential amplifier. One of the inputs to the second differential amplifier (here shown as $V_{in2}$ but the roles of $V_{in1}$ and $V_{in2}$ can be exchanged) can be connected to ground, a power-supply voltage, a feedback input, a reference voltage, a frequency compensation network, etc. as can be advantageous.

Figure 21C:
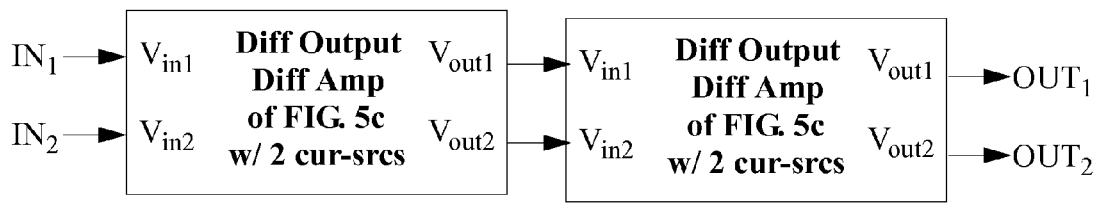

FIG. 21c depicts an exemplary two-stage differential amplifier comprising a first differential output differential amplifier followed by a second differential output differential amplifier.

Figure 22A:
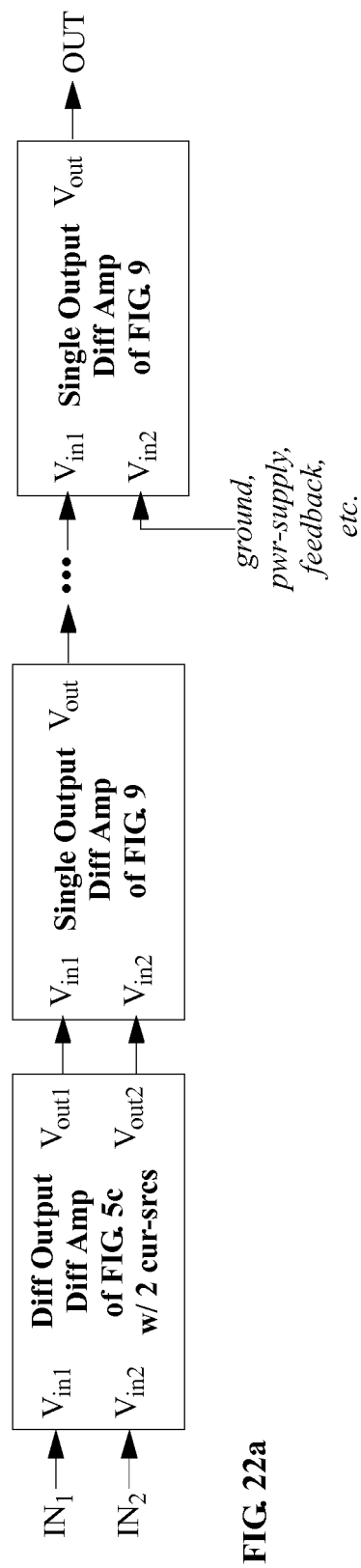

FIG. 22a depicts an exemplary multiple-stage differential amplifier comprising a differential output differential amplifier followed by a chain of at least two single output differential amplifiers. The input to a differential amplifier (here shown as $V_{in2}$ but the roles of $V_{in1}$ and $V_{in2}$ can be exchanged) whose other input is connecting to the output of a preceding single output differential amplifier can be connected to ground, a power-supply voltage, a feedback input, a reference voltage, a frequency compensation network, etc. as can be advantageous.

Figure 22B:
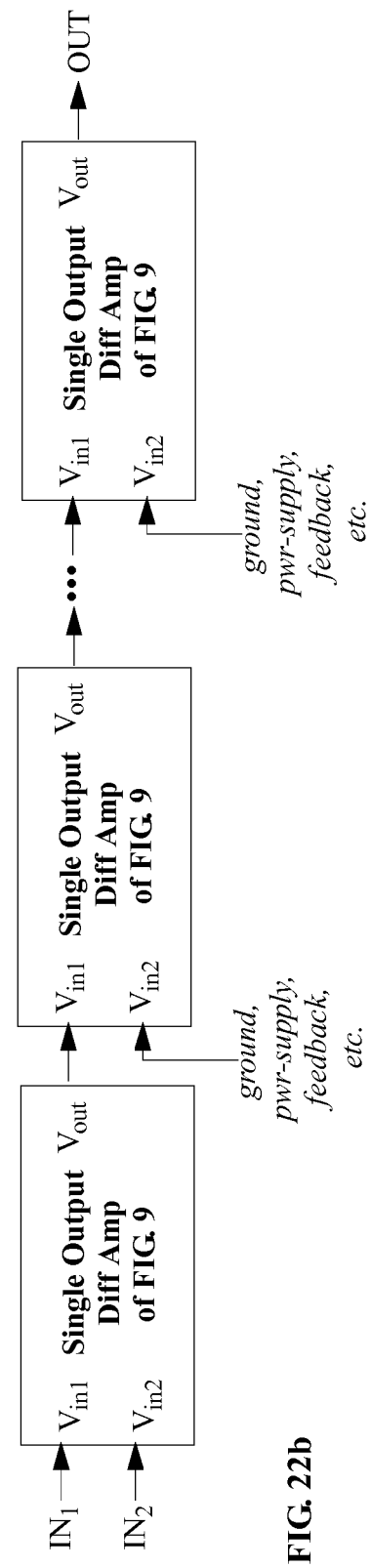

FIG. 22b depicts an exemplary multiple-stage differential amplifier comprising a chain of at least three single output differential amplifiers. The input to differential amplifiers (here shown as $V_{in2}$ but the roles of $V_{in1}$ and $V_{in2}$ can be exchanged) whose other input is connecting to the output of a preceding single output differential amplifier can be connected to ground, a power-supply voltage, a feedback input, a reference voltage, a frequency compensation network, etc. as can be advantageous.

Figure 23A:
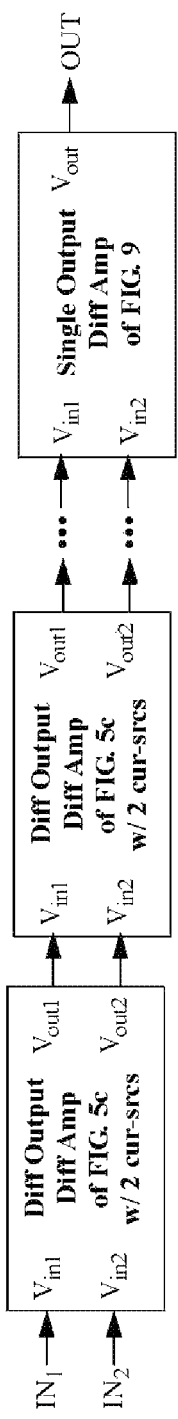

FIG. 23a depicts an exemplary multiple-stage differential amplifier comprising a chain of at least two differential output differential amplifiers followed a single output differential amplifier of a chain of single output differential amplifiers.

Figure 23B:
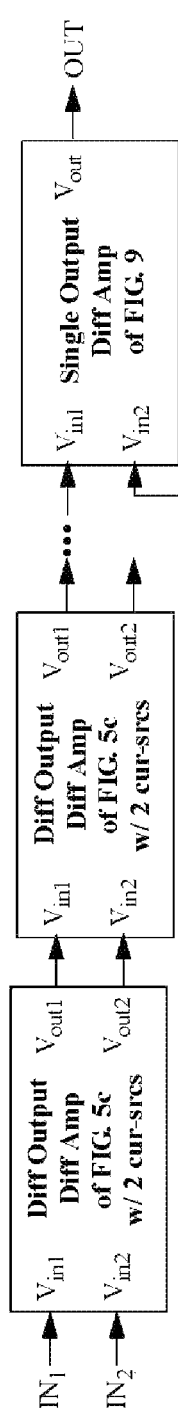

FIG. 23b depicts an exemplary multiple-stage differential amplifier comprising a chain of at least two differential output differential amplifiers followed a chain of at least two single output differential amplifiers. The input to a differential amplifier (here shown as $V_{in2}$ but the roles of $V_{in1}$ and $V_{in2}$ can be exchanged) whose other input is connecting to the output of a preceding single output differential amplifier can be connected to ground, a power-supply voltage, a feedback input, a reference voltage, a frequency compensation network, etc. as can be advantageous.

Figure 23C:
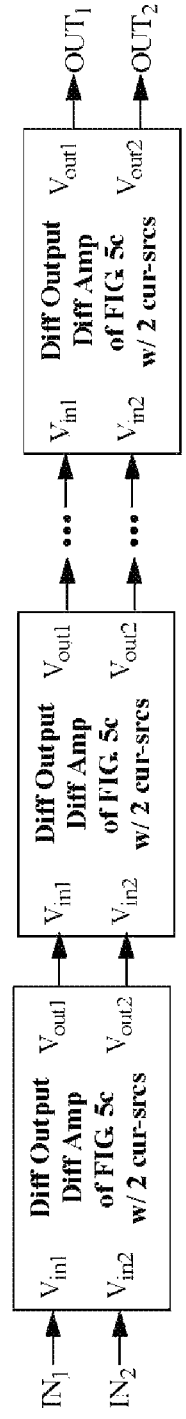

FIG. 23c depicts an exemplary multiple-stage differential amplifier comprising a chain of at least three differential output differential amplifiers.

Figure 24:
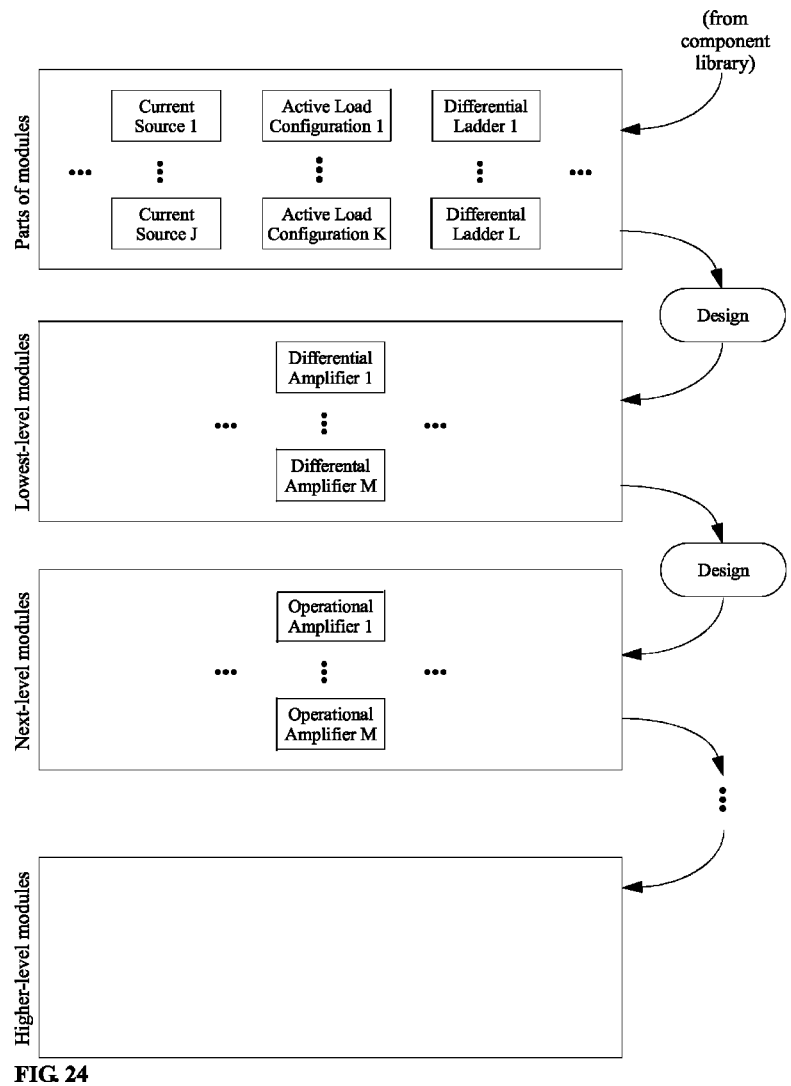
FIG. 24 depicts an example library as can be used in a computer aided design (CAD) system as provided for by the invention, the library comprising hierarchical groupings of circuits and modules.

Using approaches such as those described thus far, the invention provides for library arrangements for circuits and modules as can be used in a computer aided design (CAD) system. As an example, FIG. 24 depicts a circuit and module library arrangement as can be used in a computer aided design (CAD) system as provided for by the invention. In this example, the library comprises a hierarchical grouping of circuits and modules. As an example, individual circuit components (such as field-effect transistors, resistors, diodes, phototransistors, light-emitting diodes, light-emitting transistors, bio-FETS, nanoscale actuators, nanoscale sensors, etc.) that can be implemented on a portion of an elongated semiconducting material are drawn upon to create circuits (such as a variety of currents sources, a variety of active load configurations, a variety of differential ladders, logic circuit elements, etc.) which in turn can be used as parts of first level electronics circuit modules (such as differential amplifiers, source followers, logic gates, etc.) which in turn can be used as component modules within circuits (such as operational amplifiers, comparators flip-flops, counters, etc.) built from pluralities of such modules first level electronics circuit modules. The hierarchy can continue to include higher level modules (such as feedback regulatory controllers, digital-to-analog converters, analog-to-digital converters, arithmetic logic units, etc. Other variations of these types of features are capabilities are possible and are anticipated and provided for by the invention.

The invention provides for the libraries to comprise information of one or more types of framework such as abstract circuits, specific circuit implementations on specific types elongated semiconducting materials, parameterized implementations on specific types elongated semiconducting materials, parameterized implementations on parameterized representations of general elongated semiconducting materials, etc, fabrication steps, mask image segment information for electrode and insulating photolithography, etc., as well as electrical specifications, heat generation information, optical interfacing information, etc., where parameters are specified by the user or application and can be used to automatically generate information such as that above. Other variations of these types of features are capabilities are possible and are anticipated and provided for by the invention.

The circuits and modules elements in the libraries can also be automatically generated from specified parameterized operational quantities (gain, maximum current, voltage swing, etc.), feature size, insulation properties, etc. Other variations of these types of features are capabilities are possible and are anticipated and provided for by the invention.

In an embodiment, the above provide a framework and detailed examples for "elongated semiconductor IP-cores" and "system-on-an-elongated semiconductor" formalisms.

Once again, although systems and methods have in many instances been presented in the context or with the example of carbon nanotubes, the same principles apply when replacing the carbon nanotubes with elongated semiconducting structures such as graphene nanoribbons and strips or stripes of semiconducting polymers, organic semiconductors, or other related materials at various physical implementation scales.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

While the invention has been described in detail with reference to disclosed embodiments, various modifications within the scope of the invention will be apparent to those of ordinary skill in this technological field. It is to be appreciated that features described with respect to one embodiment typically can be applied to other embodiments.

The invention can be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

Although exemplary embodiments have been provided in detail, various changes, substitutions and alternations could be made thereto without departing from spirit and scope of the disclosed subject matter as defined by the appended claims. Variations described for the embodiments may be realized in any combination desirable for each particular application. Thus particular limitations and embodiment enhancements described herein, which may have particular advantages to a particular application, need not be used for all applications. Also, not all limitations need be implemented in methods, systems, and apparatuses including one or more concepts described with relation to the provided embodiments. Therefore, the invention properly is to be construed with reference to the claims.

I claim:

1. A method, comprising:
   modifying, using a computer-aided design system, a design representation for an analog circuit to specify a circuitry arrangement that includes a chain of two or more elongated semiconductor field-effect transistors, wherein the modifying includes replacing insulated-gate field-effect transistors in the design representation for the analog circuit with elongated semiconductor field-effect transistors.

2. The method of claim 1, wherein the modifying comprises rearranging the insulated-gate field-effect transistors in the design representation into a linear sequence of insulated-gate field-effect transistors.

3. The method of claim 1, wherein the circuitry arrangement comprises at least two terminals for receiving electrical power, and wherein the chain terminates at two chain endpoint electrical terminals, both of which function as at least a power supply terminal.

4. The method of claim 1, wherein each of the elongated semiconductor field-effect transistors comprises a portion of an elongated semiconducting material in electrical contact with two electrodes, the portion being subject to an electric field of a third electrode situated between the two electrodes, wherein the third electrode is not in electrical contact with the portion.

5. The method of claim 4, wherein the circuitry arrangement further comprises at least one additional power supply terminal for receiving electrical power, the additional power supply terminal being located at a point in the chain situated between the two electrodes, and wherein the additional power supply terminal is distinct from the two electrodes.

6. The method of claim 5, wherein the additional power supply terminal is configured to connect to a different voltage than the two chain endpoint electrical terminals.

7. The method of claim 1, wherein the circuitry arrangement comprises a chain-leapfrog topology in which an elongated semiconductor structure is placed over a plurality of underlying structures connected in a chain, and wherein a first of the plurality of underlying structures leapfrogs at least a second of the plurality of underlying structures.

8. The method of claim 1, wherein at least two elongated semiconductor field-effect transistors share an electrode.

9. The method of claim 1, wherein the two chain endpoint terminals are configured to connect to different voltages.

10. The method of claim 1, wherein the design representation for the analog circuit comprises a first current source, the first current source comprising an associated electrical current output, the method further comprising modifying the design representation for the analog circuit to specify the circuitry arrangement with a second current source, the second current source comprising an associated electrical current output arranged to be electrically connected to the electrical current output of the first current source.

11. The method of claim 10, further comprising modifying the design representation for the analog circuit to specify the circuitry arrangement with the first current source at a first end of the chain and the second current source at a second end of the chain.

12. The method of claim 1, wherein the circuitry arrangement is selected from a library that includes a plurality of arrangements applicable for implementation on at least a portion of an elongated semiconducting material.

13. The method of claim 1, further comprising implementing the circuitry arrangement that includes the chain of two or more elongated semiconductor field-effect transistors on a portion of an elongated semiconducting material.

14. A method, comprising:
    modifying, using a computer-aided design system, a design representation for an analog circuit to specify a chain-leapfrog topology in which an elongated semiconductor structure is placed over a plurality of underlying structures connected in a chain, wherein a first of the plurality of underlying structures leapfrogs at least a second of the plurality of underlying structures, wherein the modifying includes replacing insulated-gate field-effect transistors in the design representation for the analog circuit with elongated semiconductor field-effect transistors, and wherein each end of the chain is configured to receive electrical power.

15. The method of claim 14, wherein the modifying comprises rearranging the insulated-gate field-effect transistors in the design representation into a linear sequence of insulated-gate field-effect transistors before replacing insulated-gate field-effect transistors in the design representation for the analog circuit with elongated semiconductor field-effect transistors.

16. The method of claim 14, wherein each of the elongated semiconductor field-effect transistors comprises a portion of an elongated semiconducting material in electrical contact with two electrodes, the portion being subject to an electric field of a third electrode situated between the two electrodes, wherein the third electrode is not in electrical contact with the portion.

17. The method of claim 14, further comprising implementing the chain-leapfrog topology on a portion of an elongated semiconducting material.

18. A method, comprising:
    rearranging, using a computer system, a design representation for an analog circuit comprising insulated-gate field-effect transistors to specify a chain of two or more insulated-gate field-effect transistors, wherein each end of the chain is configured to receive electrical power; and
    replacing, using the computer system, the insulated-gate field-effect transistors in the design representation for the analog circuit with elongated semiconductor field-effect transistors to provide a chain of two or more elongated semiconductor field-effect transistors with each end of the chain configured to receive electrical power.

19. The method of claim 18, wherein each of the elongated semiconductor field-effect transistors comprises a portion of an elongated semiconducting material in electrical contact with two electrodes, the portion being subject to an electric field of a third electrode situated between the two electrodes, wherein the third electrode is not in electrical contact with the portion.

20. The method of claim 19, wherein the chain of two or more elongated semiconductor field-effect transistors further comprises at least one additional power supply terminal for receiving electrical power, the additional power supply terminal being located at a point in the chain situated between the two electrodes, and wherein the additional power supply terminal is distinct from the two electrodes.

21. The method of claim 18, wherein the chain of two or more elongated semiconductor field-effect transistors comprises a chain-leapfrog topology in which an elongated semiconductor structure is placed over a plurality of underlying structures connected in a chain, and wherein a first of the plurality of underlying structures leapfrogs at least a second of the plurality of underlying structures.

22. The method of claim 18, further comprising implementing the chain of two or more elongated semiconductor field-effect transistors on a portion of an elongated semiconducting material.

\* \* \* \* \*

UNITED STATES PATENT AND TRADEMARK OFFICE
CERTIFICATE OF CORRECTION

| | | |
|---|---|---|
| PATENT NO. | : 8,522,184 B2 | |
| APPLICATION NO. | : 13/114833 | |
| DATED | : August 27, 2013 | |
| INVENTOR(S) | : Ludwig | |

It is certified that error appears in the above-identified patent and that said Letters Patent is hereby corrected as shown below:

On the Title Page, in Item (54), and in the Specification, in Column 1, Line 1, under "Title", delete "HIERACHICALLY" and insert -- HIERARCHICALLY --, therefor.

In the Specification:

In Column 6, Line 26, delete "depicts" and insert -- depicts an --, therefor.

In Column 6, Line 59, delete "Kirchoff's" and insert -- Kirchhoff's --, therefor.

In Column 6, Line 63, delete "Kirchoff's" and insert -- Kirchhoff's --, therefor.

In Column 7, Line 50, delete "source," and insert -- source. --, therefor.

In Column 12, Line 20, delete "operation" and insert -- operation. --, therefor.

In Column 14, Line 6, delete "Kirchoff's" and insert -- Kirchhoff's --, therefor.

Signed and Sealed this
Twenty-ninth Day of April, 2014

Michelle K. Lee
*Deputy Director of the United States Patent and Trademark Office*